United States Patent
Sasaki et al.

(10) Patent No.: US 6,261,703 B1
(45) Date of Patent: *Jul. 17, 2001

(54) COPPER CIRCUIT JUNCTION SUBSTRATE AND METHOD OF PRODUCING THE SAME

(75) Inventors: Kazutaka Sasaki; Hirohiko Nakata, both of Hyogo (JP)

(73) Assignee: Sumitomo Electric Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/230,178
(22) PCT Filed: May 26, 1998
(86) PCT No.: PCT/JP98/02304
  § 371 Date: Jan. 21, 1999
  § 102(e) Date: Jan. 21, 1999
(87) PCT Pub. No.: WO98/54761
  PCT Pub. Date: Dec. 3, 1998

(30) Foreign Application Priority Data

May 26, 1997 (JP) .................................. 9-134912
Sep. 29, 1997 (JP) .................................. 9-262573
Mar. 17, 1998 (JP) ................................ 10-066370

(51) Int. Cl.$^7$ .................. H01L 23/12; H01L 23/14; H01L 23/50; H05K 1/09; B23K 31/02
(52) U.S. Cl. .................. 428/627; 428/621; 428/209; 174/256; 174/258; 228/122.1
(58) Field of Search .................... 426/627, 660, 426/661, 675, 620, 621, 209, 210; 174/258, 256, 259; 257/703, 705; 228/122.1, 123.1, 124.1, 124.5

(56) References Cited

U.S. PATENT DOCUMENTS 5,998,043 * 12/1999 Sasaki et al. .................. 428/627

FOREIGN PATENT DOCUMENTS

789397 A2 * 8/1997 (EP).

(List continued on next page.)

Primary Examiner—John J. Zimmerman
(74) Attorney, Agent, or Firm—McDermott, Will & Emery

(57) ABSTRACT

A highly reliable copper circuit-joined board that, in mounting a semiconductor element, a lead frame or the like on a ceramic substrate, enables the semiconductor element, the lead frame or the like to be strongly joined to the substrate without breaking or deformation of the substrate found in conventional joining methods, such as brazing and joining using a copper/copper oxide eutectic crystal. Any one of an interposing layer comprising a brazing material layer comprising silver and/or copper as a main component and an active metal or an interposing layer having a two-layer structure comprising a first interposing layer comprising the brazing material layer or a high-melting metallizing layer and a second interposing layer, having a melting point of 1000° C. or below, comprising Ni, Fe, Cu as a main component in that order from the substrate side, is formed on a ceramic substrate, and a conductor layer, comprising copper as a main component, which, in both the lengthwise and widthwise directions, is at least 0.05 mm shorter than the interposing layer, is formed on the interposing layer to prepare a copper circuit-joined board. The copper circuit-joined board may comprise the base board having thereon an outer layer comprising Ni as a main component. A semiconductor element is mounted on the copper circuit-joined board to prepare a semiconductor device.

79 Claims, 11 Drawing Sheets

FOREIGN PATENT DOCUMENTS

| | | |
|---|---|---|
| 56-163093 | 12/1981 | (JP) . |
| 59-40404 | 3/1984 | (JP) . |
| 60-32343 | 2/1985 | (JP) . |
| 60-177634 | 9/1985 | (JP) . |
| 63-289950 | 11/1988 | (JP) . |
| 64-55271 | 3/1989 | (JP) . |
| 2-34908 | 8/1990 | (JP) . |
| 4-77369 | 3/1992 | (JP) . |
| 4-79290 | 3/1992 | (JP) . |
| 5-25397 | 4/1993 | (JP) . |
| 5-152461 | 6/1993 | (JP) . |
| 8-040789 | 2/1996 | (JP) . |
| 9-069672 | 3/1997 | (JP) . |
| 9-234826 | 9/1997 | (JP) . |
| 9-275165 | 10/1997 | (JP) . |
| 9-275166 | 10/1997 | (JP) . |
| 10-125821 | 5/1998 | (JP) . |

* cited by examiner

COPPER CIRCUIT JUNCTION SUBSTRATE AND METHOD OF PRODUCING THE SAME

TECHNICAL FIELD

The present invention relates to a copper circuit-joined board which comprises a ceramic substrate and a conductor layer, comprising copper as a main component, joined to the ceramic substrate and is suitable particularly for high power modules and cooling systems of machine tools, electromobiles and the like, a process for preparing the same, and a semiconductor device using the board.

BACKGROUND ART

Ceramics, for example, alumina ($Al_2O_3$) aluminum nitride (AlN), and silicon nitride ($Si_3N_4$), have hitherto been used as an electrical insulating substrate for semiconductor devices. In this case, a circuit board for semiconductor IC using the above substrate has generally been prepared by forming and laminating a metallized circuit, composed mainly of tungsten (W) or molybdenum (Mo) or a metallized circuit composed mainly of copper (Cu), on the above substrate. The above ceramics used as the substrate possesses excellent electrical insulting properties and mechanical strength and in addition has high thermal conductivity. The thermal conductivities of alumina ($Al_2O_3$), aluminum nitride (AlN), and silicon nitride ($Si_3N_4$) are approximately 17 W/m·K, 170 W/m·K, and 60 W/m·K, respectively. Among them, aluminum nitride has electrical insulating properties comparable to alumina and silicon nitride and, as described above, has the highest thermal conductivity. By virtue of these properties, aluminum nitride has received the greatest attention as a substrate for circuit boards. Further, the average coefficient of thermal expansion of aluminum nitride, when the temperature is raised from room temperature to the brazing temperature of silver (about 800° C.), is as small as $5.5 \times 10^{-6}/°$ C. Therefore, aluminum nitride is highly compatible with an IC chip of a silicon semiconductor (coefficient of thermal expansion $4.0 \times 10^{-6}/°$ C). Although the thermal conductivity of silicon nitride is lower than that of aluminum nitride, silicon nitride has a coefficient of thermal expansion more close to the Si semiconductor than aluminum nitride and possesses superior mechanical strength. For this reason, silicon nitride has recently begun to be utilized as a substrate for a circuit board by reducing the thickness of the silicon nitride substrate to control the heat resistance. However, ceramics, including aluminum nitride, commonly used as the substrate have low coefficient of thermal expansion. In particular, when a circuit composed mainly of copper (coefficient of thermal expansion $16.7 \times 10^{-6}/°$ C.) is formed on the substrate, the compatibility of copper with the substrate is so low that the ceramic substrate is likely to be broken due to thermal stress in the joined interface created in the stage of joining of the circuit to the substrate and mounting of the assembly by incorporation and in the stage of actual use as the circuit board. For this reason, in joining the circuit to the ceramic substrate, various interposing layers have generally been provided between the circuit and the ceramic substrate in order to relax the thermal stress.

For example, Japanese Patent Publication No. 34908/1990 introduces a circuit board comprising multiple layers, each comprising silver (Ag) or copper (Cu) as a main component and a group IVa metal as an active metal, interposed between a ceramic substrate and a copper conductor layer. In the formation of a joined structure comprising the above interposing layer, however, the relaxation of the thermal stress created between copper and the ceramic is unsatisfactory particularly in the case of a large board. Therefore, what is required is to interpose an interposing layer appropriate for satisfactorily relaxing the thermal stress created between copper and the ceramic.

For this reason, in joining a ceramic substrate to a metallic member such as a lead frame, having a considerably larger coefficient of thermal expansion than that of the ceramic substrate, a method has generally been used which comprises first providing a high-melting metallizing layer comprising a high-melting metal (i.e., refractory metal), such as W or Mo, on the surface of a ceramic substrate and then joining the above metallic member on the high-melting metallizing layer with the aid of a conventional Ag—Cu-base silver brazing material. In this case, a layer comprising the high-melting metal and the conventional silver brazing material corresponds to the above-described interposing layer. For example, Japanese Patent Laid-Open No. 289950/1988 discloses a joined structure comprising a lead frame of oxygen-free copper having high thermal conductivity and thermal impact resistance joined to a high-melting metallizing layer of W provided on an aluminum nitride substrate (see FIGS. 1 and 2 of the same publication). According to the same publication, in joining the lead frame of oxygen-free copper to the high-melting metallizing layer of W, an Ni layer is previously formed between the high-melting metallizing layer and the lead frame in order to improve the wettability therebetween, and joining is then carried out using this layer as an interposing layer by silver brazing.

In this type of products, Kovar has hitherto been used as the lead frame.

As described above, however, use of the lead frame of soft oxygen-free copper instead of the lead frame of Kovar can relax the thermal stress created in the joining interface at the time of brazing as compared the prior art.

Even in the above method, use of the member as a large circuit board at a high power increases the thermal stress, often leading to breaking of the substrate.

Further, for example, methods for joining a metallic member of copper to an aluminum nitride substrate without using the conventional Ag—Cu-based silver brazing material have also been studied. One of them is the so-called DBC (direct bonding copper) method. This method utilizes an eutectic reaction of a layer of an oxide of copper, present on the surface of the metallic member of copper, with copper. For example, Japanese Patent Laid-Open No. 40404/1984 or "Erekutoronikusu Seramikkusu (Electronics Ceramics)," November, 1988, pp. 17–21 discloses the summary of this method. According to the disclosure, at the outset, on the surface of a substrate of an aluminum nitride sintered body is formed a layer of an oxide of aluminum/rare earth element/alkaline earth element used as a sintering aid for the substrate, or an oxide layer composed mainly of the sintered body. Subsequently, a metallic member of copper is put on the above layer, and the assembly is heated in an oxygen-containing atmosphere at a temperature of the eutectic point of copper and a copper oxide $Cu_2O$ to the melting point of copper to join the metallic member to the above layer. A similar method has been introduced by Japanese Patent Laid-Open No. 32343/1985. According to the description of this publication, an eutectic layer of a copper alloy containing an active metal, such as a group IVa element metal, is interposed between a member of copper and an aluminum nitride substrate to join the two materials to each other. In this case, fine holes are likely to be created in the joined interface of the copper member and the aluminum nitride substrate. On the other hand, since the interposing layer is thin, the interposing layer per se cannot satisfactorily relax the thermal stress. For this reason, the thermal stress is likely to concentrate on the hole portion, leading to cracking in the hole portion.

In the above joining method, as can be seen from FIG. 4 of the above literature "Erekutoronikusu Seramikkusu (Electronics Ceramics)," a variation in joining strength is likely to become large unless the thickness of the oxide layer on the aluminum nitride substrate is regulated within a narrow range. Further, since the interposing layer is thin, the thermal stress created due to a difference in coefficient of thermal expansion between copper and the aluminum nitride substrate cannot be relaxed. This is likely to cause breaking of the substrate in its portion around the joined interface. This unfavorable phenomenon becomes more significant with increasing the size of the substrate. Further, joining other member onto the above member by soldering results in oxidation of the surface of the copper member, making it necessary for the surface to be subjected to abrasive finishing. In the above method wherein an eutectic layer of a copper alloy containing an active metal is interposed, fine holes are likely to be created in the joined interface of the copper member and the aluminum nitride substrate. In this case, since the interposing layer is thin, cracking is likely to be created in the hole portion. Japanese Patent Laid-Open No. 152461/1993 also discloses a member comprising a copper circuit provided on a ceramic substrate. The joined structure comprises a thin interposing layer of an active metal and a copper circuit sheet with a step formed on the outer peripheral end portion thereof. The above publication describes that this joined structure can relax the thermal stress concentrated on the outer peripheral end portion of the joined portion. Also in this structure, however, the thickness of the interposing layer is so small that the relaxation of the thermal stress created in the joined interface is unsatisfactory.

Japanese Patent Laid-Open No. 55271/1989 discloses a board comprising an aluminum nitride substrate, a high-melting metallizing layer of W provided on the aluminum nitride substrate, a metallizing layer, comprising as a main component at least one member selected from the group consisting of silver, copper, and aluminum, having a thickness of not less than 1 $\mu$m provided on the high-melting metallizing layer, and a copper sheet joined thereto through an interposing layer of a solder or a silver brazing material. This publication describes that the joined structure can significantly improve the strength of joining between the substrate and the copper sheet.

Japanese Patent Laid-Open No. 69672/1997 discloses a copper circuit-joined board comprising a silicon nitride ceramic substrate, with a thermal conductivity of not less than 60 W/m·K, having thereon a brazing material layer containing an active metal of a group IVa metal or the like or a high-melting metallizing layer. In this case, in order to control the heat resistance during actual use by reducing the thickness of the substrate, the formulation of the components added and the degree of crystallization of the grain boundary phase are reexamined to improve the thermal conductivity and to improve the mechanical strength and toughness. The above publication describes that this can provide a copper circuit-joined board excellent also in thermal shock resistance. In joined structures as shown in FIG. 1 of Japanese Patent Laid-Open No. 55271/1989 and FIGS. 1, 3, and 8 of Japanese Patent Laid-Open No. 69672/1997, the thermal stress is likely to concentrate in the joined interface of the outer peripheral end portion of the interposing layer. This tends to create warpage of the copper conductor layer, and, when the size of the substrate is large, cracking is likely to occur on the substrate side in its portion corresponding to the warped portion.

As described above, various attempts have been made to join a metallic member comprising copper as a main component to the substrate through an interposing layer. In this connection, some problems as described above should be solved. Among semiconductor modules comprising a copper conductor circuit provided on the ceramic substrate intended in the present invention, particularly high-output modules (hereinafter referred to as "high-power modules") have a large substrate size. Therefore, solving the above problems has been a task necessary for practical use for many years.

The present inventors have previously proposed an improved joined structure that can solve several problems as described above with respect to ceramic circuit boards used in high-power modules (Japanese Patent Laid-Open No. 275166/1997). This joined structure comprises a high-melting metallizing layer of W, Mo or the like, an interposing layer of a low-melting metal comprising as a main component at least one member selected from the group consisting of Ni, Fe, and Cu, and a copper conductor layer in that order from the ceramic substrate side. In this case, the high-melting metallizing layer functions to relax the thermal stress created by the difference in coefficient of thermal expansion between aluminum nitride and copper, while the interposing layer functions to improve the wettability between the high-melting metallizing layer and copper during joining. This joined structure is different from the joined structure described in Japanese Patent Laid-Open No. 55271/1989 in that the conventional brazing material layer of silver brazing material, solder or the like is absent in the joined portion. Since the brazing material layer is absent, unlike the joined structure containing the brazing material layer as described in Japanese Patent Laid-Open No. 55271/1989, the warpage of the copper sheet does not occur. Further, various problems involved in the DBC method, wherein joining is carried out through a relatively thin joining layer formed of an eutectic phase, containing an active metal, or a brazing material, have been substantially eliminated.

In the same application, the present inventors have further proposed the following preferred joined structures. The first preferred joined structure is such that, in the above basic structure, the length and width in the planar direction of the conductor layer in the joined interface of the conductor layer and the interposing layer are shorter than those of the interposing layer provided just under the conductor layer. The second preferred joined structure is such that, in the above basic structure, the angle of the side of the conductor layer to the top surface of the interposing layer provided just under the conductor layer is not more than 80°. The effect, attained by the adoption of the above structures, that has been found to be advantageous for practical use, is mainly the avoidance of the discharge phenomenon created between the substrate and the conductor layer at the time of the energization of the conductor layer.

Thereafter, the present inventors have made a confirmative experiment on further practical effects of the above preferred joined structures. As a result, it has been found that, in addition to the above effect, these joined structures have the effect of relaxing the thermal stress. For example, structures shown in drawings of Japanese Patent Laid-Open No. 55271/1989 and Japanese Patent Laid-Open No. 69672/1997 have been found to eliminate a problem that, in particular, a larger size of the substrate results in higher concentration of the thermal stress on the outer peripheral end portion of the substrate, leading to warpage of the conductor layer or cracking of the substrate. It has also been found that, even when the interposing layer includes the brazing material layer as described before, the formation of the above basic structure can solve the same problem. The present inventors have made further studies and have proposed, in addition to the first and second basic joined structures, the formation of an outer layer, comprising Ni as a main component, on the outer peripheral surface of the conductor layer and the interposing layer (Japanese Patent Application No. 134912/1997) as the third basic joined structure which can get higher thermal stress relaxing effect. This basic joined structure can add the effect of dispersing the thermal stress in the outer layer, realizing a module having higher reliability.

In the field of high-power modules, however, an ever-increasing demand for a further reduction in size in addition to an increase in capacity is expected in the future. For this reason, a joined structure, based on the above basic joined structure, having a smaller size and higher integration density has been desired in the art. Therefore, a module board which has been desired to appear is a high-capacity module board comprising joining units laminated on top of one another, the number of joining units being larger than that in the prior art. The joining units each comprise a joined structure comprising a combination of a ceramic substrate layer having excellent thermal conductivity and electrical insulating properties with a conductor layer having excellent electrical conductivity. In view of the above situation, it is an object of the present invention to provide a copper circuit-joined board comprising one lamination unit or two or more lamination units joined to each other or one another, each lamination unit being a basic structure comprising copper joined onto a ceramic substrate, especially a copper circuit-joined board, having high reliability unattainable by the prior art technique, for high-power modules.

DISCLOSURE OF INVENTION

In order to attain the above object, one type of the first copper circuit-joined board provided by the present invention is a copper circuit-joined board having a basic joined structure comprising one joining unit or a laminate of two or more joining units joined to each other or one another, the joining units each comprising a ceramic substrate and a conductor layer, comprising copper as a main component, provided on the ceramic substrate through an interposing layer, wherein, in all the joining units, the length (that is, dimension in the longitudinal direction) and width (that is, dimension in the lateral direction) in the planar direction of the conductor layer in the joined interface of the conductor layer and the interposing layer are at least 0.05 mm shorter than those in the planar direction of the interposing layer, the outer peripheral side portion of the conductor layer (in the same joined interface) being not extended from the outer peripheral side portion of the interposing layer, (apart from this) at least a part of the side portion of the conductor layer excluding the joined interface being extended from the side portion of the interposing layer in at least one of the joining units. Another type of the first copper circuit-joined board provided by the present invention is a copper circuit-joined board having a basic joined structure comprising one joining unit or a laminate of two or more joining units joined to each other or one another, the joining units each comprising a ceramic substrate and a conductor layer, comprising copper as a main component, provided on the ceramic substrate through an interposing layer, wherein, in all the joining units, the length (that is, dimension in the longitudinal direction) and width (that is, dimension in the lateral direction) in the planar direction of the conductor layer in the joined interface of the conductor layer and the interposing layer are at least 0.05 mm shorter than those in the planar direction of the interposing layer, the outer peripheral side portion of the conductor layer in the same joined interface being not extended from the outer peripheral side portion of the interposing layer, the side portion of the conductor layer being not extended from the side portion of the interposing layer in all the joining units.

For each of the above first boards according to the present invention, the basic joining unit of the board comprises an electrically insulating ceramic substrate, an interposing layer for joining, and a conductor layer comprising copper as a main component in that order from the substrate side. Therefore, in the lamination of two or more joining units of this type on top of each other or one another, the as interposing layer is disposed on the conductor layer, and the ceramic substrate layer is then disposed on the interposing layer, followed by repetition of the lamination of these elements in this order.

In all the joining units, for both the lengthwise direction and the widthwise direction, the dimension in the planar direction of the conductor layer in the joined interface of the conductor layer and the interposing layer are at least 0.05 mm shorter than that in the planar direction of the interposing layer. Further, the outer peripheral side portion of the conductor layer in the joined interface is not extended from the outer peripheral portion of the interposing layer. For the first type of the first board, in at least one of the joining units, the dimension in the lengthwise direction and/or the lateral direction of at least a part of the conductor layer excluding the joined interface of the conductor layer and the interposing layer is longer than that of the interposing layer and extended from the outer peripheral end of the interposing layer. The "joined interface of the conductor layer and the interposing layer" used herein refers to a portion where the conductor layer is in direct contact with the interposing layer. The "side portion of the conductor layer excluding the joined interface" refers to a side portion, of the conductor layer, where the conductor layer is not in direct contact with the interposing layer. Therefore, for example, in the first board according to the present invention, when the number of joining units is one, in the joined interface where the conductor layer is in direct contact with the interposing layer, the outer peripheral portion of the conductor layer is not extended from the outer peripheral portion of the interposing layer, as viewed from the direction of the lamination, that is, a direction perpendicular to the main plane of the laminate. On the other hand, in another portion of the conductor layer where the conductor layer is not in direct contact with the interposing layer, at least one site of the conductor layer is extended from the outer peripheral portion of the interposing layer (a protruded portion of the conductive layer described below). In the case of two units, only one unit may have the above construction, or alternatively, both the units may have the above construction. Next, for another type of the first board, in all the joining units, the side portion of the conductor layer is not extended from the side portion of the interposing layer.

In this first board, a circuit pattern, in the direction of the main plane of the conductor layer, which serves as a circuit for connection to the external, may vary depending upon applications. Therefore, for a module board comprising one joining unit, the circuit may be formed on the whole main plane of the interposing layer, or alternatively may be formed on a part of the main plane. That is, the conductor layer may be absent on a part of the interposing layer. On the other hand, for a module comprising two or more joining units, if necessary, a joining unit comprising a conductor layer provided on a part of the interposing layer or having no conductor layer may be disposed.

The second board according to the present invention is a preferred embodiment of the first board. The second board is such that, in the above basic structure, the angle of the side portion of the conductor layer to the joined interface of the conductor layer and the interposing layer is not more than 80°. When the extreme end unit of the laminate is the conductor layer, the main plane of the conductor layer opposite to the joined interface is a free surface on which nothing is present. In this case, the angle of this surface to the conductor layer in its side face is generally brought to not less than 80°. When another member or component is joined onto this surface, if necessary, the angle is previously brought to not more than 80°.

The third board according to the present invention is one of preferred embodiments of the first and second boards. In the third board, the outer peripheral side portion of the conductor layer is step-formed.

In this type of the board, the height (or thickness) of the lowermost step joined to the interposing layer is not more than one-third of the thickness of the whole conductor layer. In some cases, the length of a collar portion of the lowest step portion in the joined interface of the conductor layer and the interposing layer in the planer direction is not less than half of the thickness of the whole conductor layer.

The fourth board according to the present invention is one of further preferred embodiments of the first and second boards. Specifically, the fourth board is such that, in the first or second basic structure, an outer layer comprising nickel as main component is provided on the whole outer surface of the conductor layer and the interposing layer. This outer layer is not formed on the ceramic substrate in its exposed outer surface except for a portion where the interposing layer has been formed. In some cases, if necessary, the outer layer is formed on a part of the conductor layer and the interposing layer. In the case of a laminate structure comprising two or more joining units, the outer layer is often provided on the main surface, on which the interposing layer is formed,—(supported by FIGS. 5(a) and 5(b) and the description in the paragraph bridging pages 51 and 52. Tn these figures, the outer layer 5 is formed on the main surface, not the outer surface, of the substrate 1). of the ceramic substrate layer in the second or later unit. In any event, the outer layer may be provided in any arrangement so far as the localization/concentration of the thermal stress as a whole board can be eliminated and, in addition, neither warpage nor the damage to the substrate occur during preparation and during actual use.

The board according to the present invention has the above four basic structures. There are several embodiments regarding the fundamental composition and disposition of the interposing layer for joining the conductor layer to the ceramic substrate. According to the first embodiment, the interposing layer comprises a layer of a brazing material comprising at least one of silver (Ag) and copper (Cu) as a main component and an active metal. When the interposing layer comprises the brazing material layer, the interposing layer may consist of the brazing layer alone. Alternatively, the interposing layer may comprise the brazing material layer and a layer of a low-melting metal, having a melting point of 1,000° C. or below, comprising as a main component at least one member selected from the group consisting of nickel, iron, and copper in that order from the substrate side. Further, the interposing layer may comprise a high-melting metallizing layer comprising a high-melting metal as a main component and the brazing material layer in that order from the substrate side. The brazing material layer may contain an active metal. In general, the active metal is preferably a group IVa or Va metal. According to the second embodiment, the interposing layer comprises the layer comprising a high-melting metal as a main component and the low-melting metallizing layer in that order from the substrate side. When the high-melting metallizing layer is formed as a layer for constituting the interposing layer on the substrate, preferably, the high-melting metallizing layer on its side opposite to the substrate has a surface roughness Ra of not more than 4 μm. The low-melting metallizing layer used in the above interposing layer may be formed of an Ni—P-based or Ni—P-based plating layer.

When the interposing layer has a two-layer structure, the two layers may not be always identical to each other in the length and width in the planar direction. For example, when the high-melting metallizing layer and the low-melting metallizing layer are laminated, the dimensions of the former may be larger than those of the latter. Although the thickness of the interposing layer may vary depending upon the size of the substrate (in general, the total thickness of the interposing layer should be increased with increasing the dimension in the planar direction of the main plane of the substrate on which the interposing layer is to be formed), it should be at least several μm. In general, for the brazing material layer and the high-melting metallizing layer, the thickness is advantageously about 3 to 50 μm, and, for the low-melting metallizing layer, the thickness is advantageously about 2 to 40 μm.

In the board according to the present invention, preferably, the thickness of the conductor layer and the thickness of the substrate are previously set so that they can satisfy the inequality $y \geq 0.5x + 0.48$ wherein x represents the thickness of the conductor layer, mm, and y represents the thickness of the ceramic substrate, mm.

The substrate is preferably made of a material having high thermal conductivity and puncture voltage. Possessing excellent mechanical strength and toughness in addition to these properties is preferred. Further, with expansion of use environments under which this type of the board is used, possessing excellent resistance to moisture and gas atmosphere besides the above properties is of ever-increasing importance. In view of the above, according to the present invention, an aluminum nitride (AlN) or silicon nitride ($Si_3N_4$) is advantageously selected as the ceramic for the substrate. Depending upon load capacity and service conditions, various ceramics, such as a ceramic consisting of a single main component of alumina ($Al_2O_3$) or the like and a ceramic of a composite comprising several main components, may be selected.

According to the present invention, there is provided a process for preparing a copper circuit-joined board comprising the steps of: (1) providing a ceramic substrate; (2) providing conductor materials (I) and/or (II), the length and width in the planar direction of the conductor materials (I) and (II) each in its portion to be directly joined to the interposing layer being at least 0.05 mm shorter than those in the planar direction of the interposing layer, the conductor material (I) being in such a form that, after joining, at least a part of the end in the planar direction of the portion not to be joined directly to the interposing layer is extended from the end of the interposing layer, the conductor material (II)

being in such a form that, after joining, the portion not to be joined directly to the interposing layer in the planar direction is not extended from the end of the interposing layer; (3) selecting the materials (I) and/or (II), for each lamination unit, as a predetermined conductor layer material, disposing a material for the interposing layer between the substrate and the conductor layer material or between conductor layers to prepare a predetermined joining unit, and then providing the joining unit by one as an joining assembly or repeatedly laminating the joining unit twice or more on top of each other or one another to prepare a joining assembly; (4) heating the assembly in the temperature range of the melting point of the component(s) of the interposing layer to below the melting point of the conductor layer material to form a joined body; and (5) finishing the joined body.

The step (1) of providing the ceramic substrate involves the step of forming a high-melting metallizing layer on the ceramic substrate, that is, the step of preparing the so-called "metallized ceramic substrate." The metallized ceramic substrate may be prepared by the so-called "post firing metallization method" wherein a paste containing a high-melting metal is applied onto a sintered ceramic substrate by printing as described below, and then fired, or by the so-called "cofiring metallization method" wherein the same paste as described above is applied onto a green compact of a starting material for the ceramic by-printing and fired simultaneously with sintering of the ceramic. In the present invention, the post firing metallization method will be often referred to simply as a post firing method, and the cofiring metallization method simply as a cofiring method.

In the second board according to the present invention, the angle of the side portion of the conductor layer to the joined interface of the conductor layer and the adjacent interposing layer is finally regulated to not more than 80°. In the third board according to the present invention, a step is finally provided on the side of the conductor layer. The above regulation is carried out in the step (2) of providing a material for the conductor layer, or in the step (4) of finishing, depending upon the form of the circuit-of the conductor layer.

In the fourth board according to the present invention, a layer comprising Ni as a main component is finally provided on the outer surface of the conductor layer and the interposing layer. This is generally carried out in the step (4) of finishing. In this case, however, a conductor layer may be previously formed by plating or printing and baking and the like and used also as an interposing layer for forming a joined assembly. The step (4) of finishing involves, besides the above steps, the step of surface treatment and finishing of the dimension and surface and various related steps necessary for mounting of semiconductor ICs and other components and members.

Further, according to the present invention, there are provided a semiconductor device comprising a semiconductor element which has been die-bonded to a copper circuit-joined board having various joined structures as described above, and a cooling system having the semiconductor device connected thereto.

BEST MODE FOR CARRYING OUT THE INVENTION

Figure 1A:
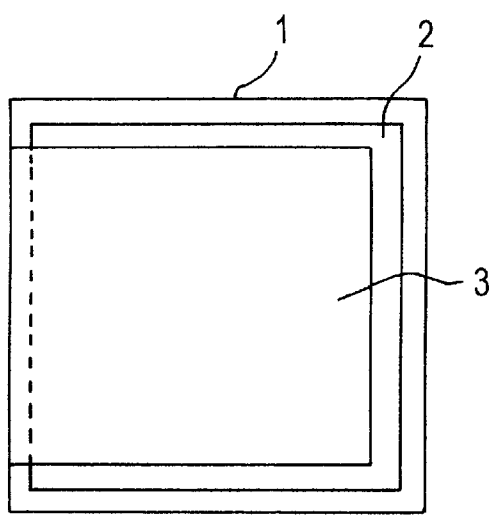
FIG. 1(*a*) and FIG. 1(*b*) are a schematic diagram showing a comparison example of the present invention wherein a part of the main plane of the conductor layer is extended from the main-plane of an interposing layer underlying the conductor layer.

The first copper circuit-joined board according to the present invention is a copper circuit-joined board having a basic structure comprising one joining unit or a laminate of two or more joining units joined to each other or one another, the joining units each comprising a ceramic substrate and a conductor layer, comprising copper as a main component, provided on the ceramic substrate through an interposing layer. Specifically, the copper circuit-joined board comprises a laminate of units of (substrate layer-interposing layer-conductor layer), or repeatedly laminated units, like (substrate layer-interposing layer-conductor layer), . . . . In the case of the laminate, one or both ends of one board may be terminated with any of the conductor layer, the interposing layer, and the substrate. In this case, for all the lamination units, identical materials are generally used respectively for the conductor layer, the interposing layer, and the substrate layer. If necessary, however, for lamination units, dissimilar materials may be used in combination. According to the board, of the present invention, having the above basic structure, in the joined interface of the conductor layer and the interposing layer, the length (that is, dimension in the longitudinal direction) and the width (that is, dimension in the lateral direction) in the planar direction of the conductor layer are at least 0.05 mm shorter than those in the planar direction of the interposing layer, and the peripheral side portion of the conductor layer (in the same joined interface) is not extended from the peripheral side portion of the interposing layer. Further, apart from this, in the first type of the first board according to the present invention, in at least one lamination unit, at least a part of the side portion of the conductor layer excluding the joined interface being extended from the side portion of the interposing layer. In another type of the first board according to the present invention, in all the joining units, the side portion of the conductor layer is not extended from the side portion of the interposing layer. Thus, the board according to the present invention is a copper circuit-joined board particularly having a basic joined structure of which the conductor layer is in a characteristic form.

According to the board of the present invention, as described above, the outside dimension of the conductor layer on its interface where the interposing layer is joined directly to the conductor layer, is small. In several lamination units, however, any site of the conductor layer in its portion not located on the joined interface of the conductor layer and the interposing layer, has a larger outside dimension than the interposing layer. The site having the large size often serves also as a terminal-for output to the external when the board is incorporated in a semiconductor device. Therefore, various shapes are considered for the conductor layer in its site having a large size.

Figure 3A:
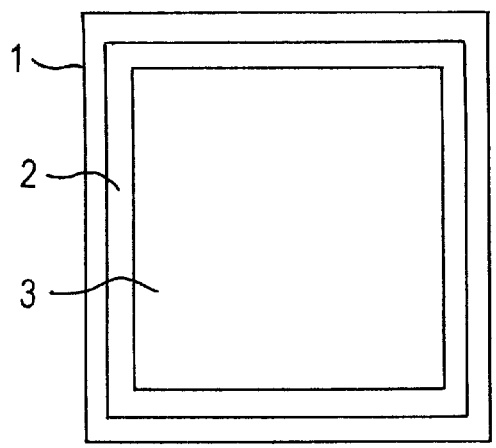
FIG. 3(*a*) and FIG. 3(*b*) are a schematic diagram showing an embodiment of the basic joined structure of the board according to the present invention.
Figure 3B:
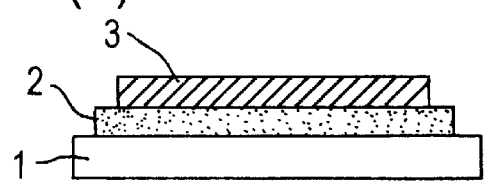

Regarding the first type of the first board, for example, FIG. 11 shows the cross-section of several possible embodiments of a board having a joined structure comprising two lamination units. The board shown in FIG. 11(a) is such that a conductor layer 3b prepared by laminating two sheet materials on top of each other is disposed just on a substrate 1b as a lowermost layer. The material for the smaller sheet constituting the conductor layer may be a sheet. Alternatively, the smaller sheet constituting the conductor layer may be formed as a thick-film layer using a copper paste or the like on a material for the larger layer constituting the conductor layer. Both the materials may be united by interposing a brazing material layer or a plating between these materials. In joining an interposing layer 2c on the substrate 1b as the lowermost layer to the conductor layer 3b, having a protruded portion 17, provided just on the interposing layer 2c, a recess 18 as shown in the drawing may be previously provided in the base of the protruded portion by etching, plastic working or other method. This can render the dimension of the conductor layer 3b smaller than that of the interposing layer 2c in the joined interface of the conductor layer and the interposing layer. Various shapes of the recess are possible. For example, the base of the protruded portion may be worked into various shapes as shown in enlarged views ((d), (e), and (f)) given in the lower part of FIG. 11. Further, the joining portion for lamination can be worked, for example, as shown in (g), (h), and (i). In FIG. 11(b), a small step 18 is provided in the peripheral portion in the joined interface on the upper surface (facing the upper substrate) of the conductor layer 3b provided on the substrate 1b as the lowermost layer. This step may be previously formed by etching, plastic working or other method. The protruded portion 17 of the conductor layer shown in the same drawing can be freely bent at any time according to the package structure. FIG. 11(c) shows another embodiment of the joined structure. Another type of the first board according to the present invention is based on a joining unit as shown in FIG. 3. According to the board of the present invention, as described above, on the joined interface of the conductor layer and the interposing layer, the size of the conductor layer is necessarily smaller than that of the adjacent interposing layer. Even when the size of the conductor layer in its portion other than the joined interface is larger than that of the interposing layer, the fundamental effect of dispersing and relaxing the thermal stress can be attained. When the number of joining units is one, the material (I) is selected as the material for the conductor layer from the two materials and is used as at least one layer. In this case, the conductor layer is indicated, for example, by 3b in FIG. 11. When the number of joining units is two or more, the conductor layer of the material (I) may be used in the lowermost lamination unit only, or alternatively may be, if necessary, used in two or more lamination units.

Figure 11A:
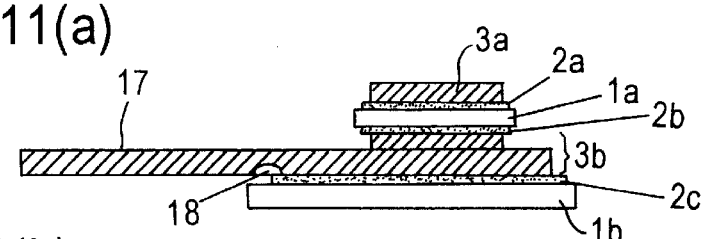
FIG. 11(*a*), FIG. 11(*b*), FIG. 11(*c*), FIG. 11(*d*), FIG. 11(*e*), FIG. 11(*f*), FIG. 11(*g*), FIG. 11(*h*), and FIG. 11(*i*) are a schematic diagram showing embodiments of the formation of a conductor layer in the board according to the present invention.
Figure 11B:
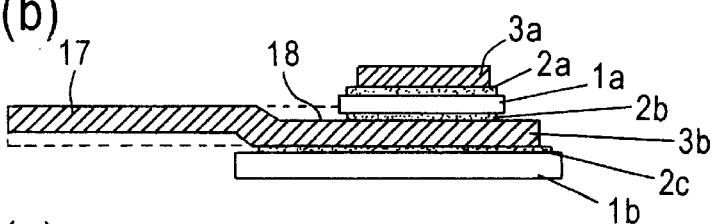
Figure 11C:
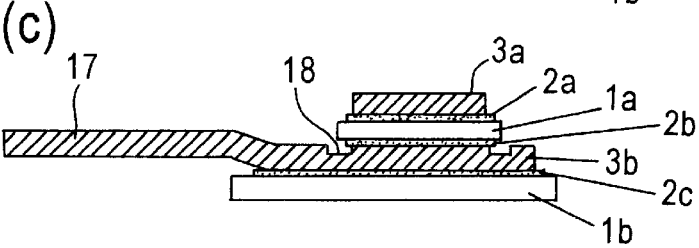
Figure 11D:
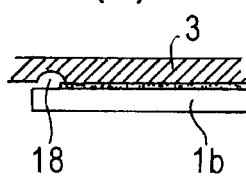
Figure 11E:
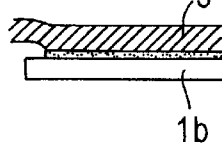
Figure 11F:
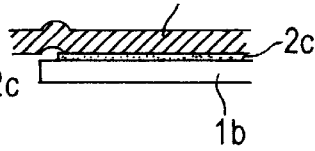
Figure 11G:
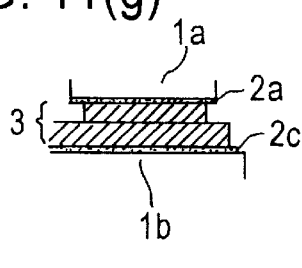
Figure 11H:
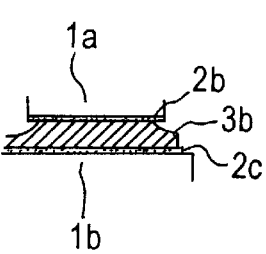
Figure 11I:
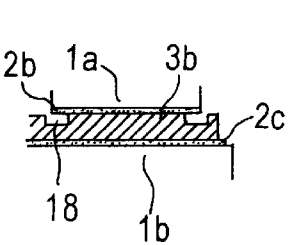

For example, FIGS. 11(a) to (c) show boards each comprising two joining units. In this case, the conductor layer, corresponding to the material (II), not extended from the outside dimensions of the underlying interposing layer is indicated by 3a.

A pattern of the conductor layer (that is, a copper circuit) as viewed from the top may be varied according to applications of the board for modules. Embodiments of the pattern are shown in FIG. 15.

In FIG. 15, reference numerals are given according to FIG. 11. FIG. 15(d) is a cross-sectional view of the board. In this structure, the joined structure in the first unit (lower unit) is the same as that shown in FIG. 11(c). However, the joined structure in the second unit (upper unit) is different from the joined structure in the second joining unit shown in FIG. 11(c). FIG. 15(c) is a diagram showing this board as viewed from the top. The second unit shown in FIG. 15(b) is put on top of and joined to the first unit shown in FIG. 15(a). In this connection, it should be noted that, as shown in FIG. 15(d) (cross-sectional view), an interposing layer 2b is provided on the backside of the second unit, of the board, shown in FIG. 15(b).

Figure 15A:
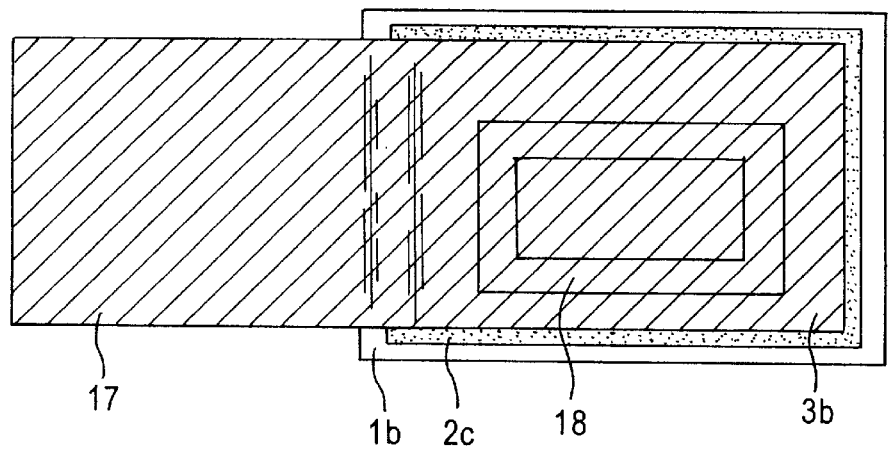
FIG. 15(*a*), FIG. 15(*b*), FIG. 15(*c*), and FIG. 15(*d*) are a schematic diagram showing embodiments of the formation of a conductor layer in the board according to the present invention.
Figure 15B:
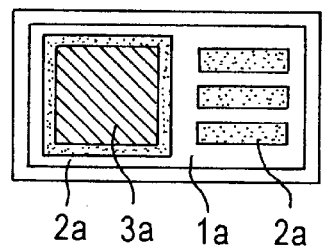
Figure 15C:
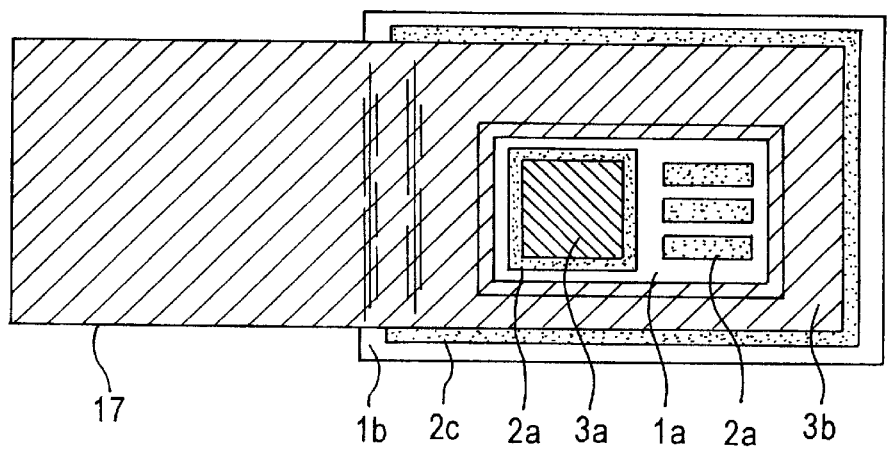
Figure 15D:
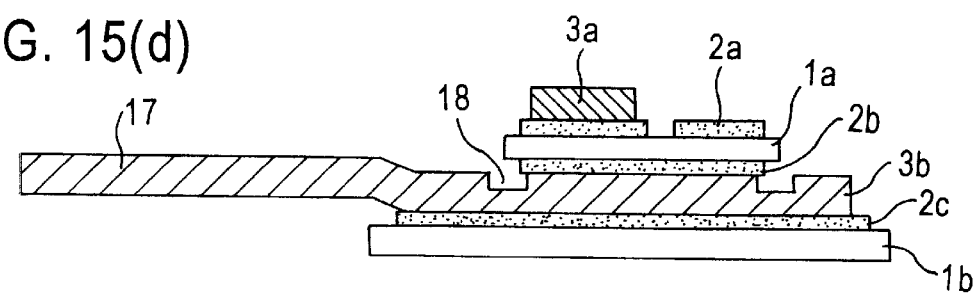

In the second unit of the board, a second conductor layer 3a is provided on the left side. On the other hand, an interposing layer 2a divided into three patterns is formed on the right side. A circuit pattern of the conductor layer is not provided on the interposing layer 2a divided into three patterns. In FIG. 15(a), numeral 18 designates a recess portion as shown in FIG. 15(d) (cross-sectional view). Regarding the circuit pattern of the conductor layer, in some cases, for example, only the interposing layer is provided on the second ceramic substrate with no circuit pattern of the conductor layer provided on the interposing layer.

Ceramic sintered bodies usable as the substrate include, for example, one comprising alumina, aluminum nitride, or silicon nitride as a main component. These sintered bodies are prepared by adding a conventional sintering aid, such as a compound of a rare earth element, such as $Y_2O_3$, a compound of an alkaline earth metal, such as CaO, or a compound of various transition metal elements, such as $SiO_2$ or $TiO_2$, and conducting sintering. The relative density of the sintered body is not less than 95%, preferably not less than 98%. The thermal conductivity of these ceramics is generally on the above level. However, the higher the thermal conductivity of the ceramic, the better the results. Preferably, the thermal conductivity is not less than 20 W/m·K for a ceramic comprising alumina as a main component, not less than 100 W/m·K for a ceramic comprising aluminum nitride as a main component, and not less than 30 W/m·K for a ceramic comprising silicon nitride as a main component. More preferably, the thermal conductivity is not less than 40 W/m·K for a ceramic comprising alumina as a main component, not less than 150 W/m·K for a ceramic comprising aluminum nitride as a main component, and not less than 60 W/m·K for a ceramic comprising silicon nitride as a main component.

Among ceramics for the substrate, particularly silicon nitride ceramics, unlike aluminum nitride ceramics, is less likely to undergo a change of properties upon exposure to water or an alkali, that is, has excellent environmental resistance, and in addition has excellent electrical insulating properties and mechanical strength. In particular, the mechanical strength of the silicon nitride ceramics is considerably higher than that of the aluminum nitride ceramics and hence has attracted attention as a substrate for the circuit board of the present invention. By virtue of the excellent mechanical strength, for example, when this ceramic is used in a board that radiates heat toward the thicknesswise direction of the substrate, the thickness of the substrate can be reduced. Therefore, although the thermal conductivity of silicon nitride is smaller than that of aluminum nitride, a substantially low thermal resistance value can be advantageously obtained. Further, a reduction in thickness per substrate can realize an increase in integration density and an increase in capacity of a circuit board comprising multiple laminated substrates. Reducing the oxygen content in the crystal grain of $Si_3N_4$ may be mentioned as one means for providing a silicon nitride ceramic having high thermal conductivity and high strength. Means necessary for promoting deoxidation of the crystal grain is such that (1) the content of oxygen in the starting material is lowered and (2) the amount of a compound of a rare earth element, an alkaline earth element, a group IVa element or the like, which has hitherto been added as a sintering aid and functions as an deoxidizer, is regulated to a suitable amount, accelerating the transformation of the crystal grain to β crystal. The target content of oxygen in the crystal grain of $Si_3N_4$ is not more than 10% by weight, preferably not more than 5% by weight, more preferably not more than 1% by weight. (3) Minimizing the amount of a cationic impurity, which dissolves in solid solution in the crystal grain and lowers the inherent thermal conductivity, particularly the amount of an aluminum compound capable of forming a sialon, is also one of the means for reducing the oxygen content. The amount of the cationic component is preferably reduced to not more than 1% by weight in terms of oxide based on the sintered body.

Silicon nitride ceramics, which can be advantageously used as the substrate for the circuit board according to the present invention, include, for example, those, as described in Japanese Patent Laid-Open No. 69672/1997 noted above, prepared by taking the above items (2) and (3) into consideration. By contrast, as described above, the thermal conductivity of silicon nitride ceramics which have hitherto been developed while taking priority to an improvement in mechanical strength (in the present invention, this type of ceramic will be hereinafter referred to as the "onventional silicon nitride ceramic"), is about 50 W/m·K at the highest. As disclosed in the above publication, however, silicon nitride ceramics having a thermal conductivity of not less than 50 W/m·K and a flexural strength of not less than 600 MPa have recently been developed (in the present invention, this type of ceramic will be hereinafter referred to as a "high-thermal conductivity silicon nitride ceramic"). In particular, some of silicon nitride ceramics, wherein the rare earth element in the grain boundary phase is a lanthanide element and the grain boundary phase contain compounds of an alkaline earth element or a group IVa element in minor amounts, have a thermal conductivity of not less than 150 W/m·K and a flexural strength of not less than 1,000 MPa. It has been confirmed that use of the silicon nitride ceramic having high strength and high thermal conductivity, as described above, as a substrate for the circuit board according to the present invention, can provide a circuit board that, as compared with a circuit board using an aluminum nitride ceramic substrate having the same length and width as the silicon nitride ceramic, even in the case of a thickness of about 70% of the thickness of the aluminum nitride ceramic, can satisfactorily withstand thermal shock and mechanical load during actual use and possesses excellent environmental resistance. Further, it has been confirmed that, in these ceramics, even complicate forms of various structures pose no practical problem in various types of metallization.

When a high-melting metallizing layer is formed on the surface of the substrate, a layer for accelerating the bonding may be formed on the surface of the substrate in its face on which the high-melting metallizing layer is to be formed. Components usable for this layer include, for example, oxides usable as the sintering aid for the substrate. In the case of a substrate comprising as a main component aluminum nitride or silicon nitride, in some cases, after the surface of the substrate is previously oxidized, a layer comprising the oxide as a main component is formed. Among the above ceramics, a ceramic comprising as a main component aluminum nitride or silicon nitride possessing excellent heat radiation and thermal shock is preferred. A ceramic comprising aluminum nitride as a main component is particularly preferred. In order to reduce the thermal resistance of the substrate, the thickness of the substrate should be minimized. For this purpose, for example, the flexural strength of the ceramic is preferably not less than 400 MPa for a ceramic comprising aluminum nitride as a main component and not less than 700 MPa for a ceramic comprising silicon nitride as a main component.

Examples of materials, comprising copper as a main component, used as the conductor layer include copper, such as oxygen-free copper and tough pitch copper or its alloys, composite alloys of copper, such as copper-molybdenum-base, copper-tungsten-base, and copper-molybdenum-tungsten-base composite alloys, and clad materials having both high electrical conductivity and low coefficient of thermal expansion, such as copper-molybdenum-copper. If necessary, an enclosure material used in a semiconductor device, for example, an Fe—Ni—Co-base alloy, such as Kovar, an Fe—Ni-base alloy, such as 42 alloy, Ni or an Ni-base alloy, Cu or a Cu-base alloy, W, Mo, or a W- or Mo-base alloy, may be joined directly or indirectly onto the conductor layer.

Figure 1B:
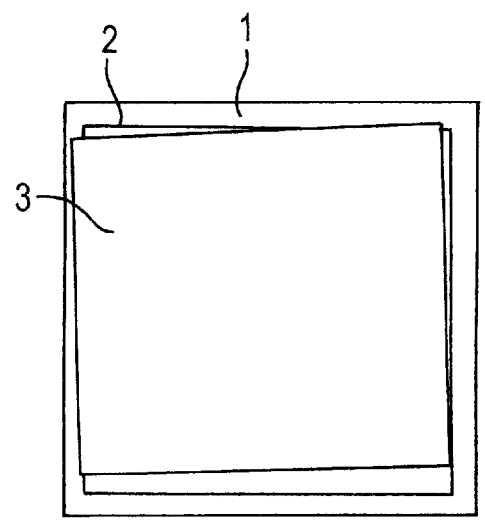

Further, as described above, the conductor layer in its main plane joined directly to the interposing layer has smaller outside dimensions than the main plain of the interposing layer provided just under the conductor layer. More specifically, in the planar direction, the size of the above main plane in both the lengthwise and widthwise directions is at least 0.05 mm shorter than that of the interposing layer provided just on or under the conductor layer, and, after joining, as viewed from a direction perpendicular to the main plane (that is, planer direction) (that is, as viewed from the top), the peripheral side portion is not extended from the end of the interposing layer provided just on or under the conductive layer. In this case, the size is particularly preferably shorter by 0.05 to 1 mm. In this case, care should be taken so as not to cause such an unfavorable phenomenon that, although the length and width of the main plane of the conductor layer as a circuit of copper are shorter than those of the interposing layer, for example, as shown in FIG. 1 (a schematic diagram of a taken-off portion of a joint between the conductor layer and the interposing layer), the joining position is shifted after joining, causing the peripheral portion of the conductor layer to be extended from the interposing layer in the joined interface. In FIG. 1(a), the conductor layer 3 is shifted in the left horizontal direction and extended from the left end of the interposing layer 2 provided just under the conductor layer. On the other hand, in FIG. 1(b), the conductor layer 3 is slantingly shifted, and a part of the conductor layer is extended from the end of the interposing layer 2 provided just under the conductor layer. When the assembly is constructed so that, as viewed from above the conductor layer 3 after joining, the outer peripheral portion of the conductor layer is not extended from the interposing layer, it is possible to prevent such an unfavorable phenomenon that the thermal stress is concentrated on the conductor layer in its portion extended from the interposing layer in the joined interface of the conductor layer and the interposing layer, leading to damage to the extended portion, and, during energization, a discharge phenomenon occurs between the conductor layer and the substrate. In order to maintain electrical insulation between the top surface of the substrate and the back surface of the substrate, the outer peripheral size of the interposing layer is preferably shorter than that of the substrate. This can prevent damage to the substrate due to concentration of the thermal stress on the edge portion of the substrate.

Figure 2A:
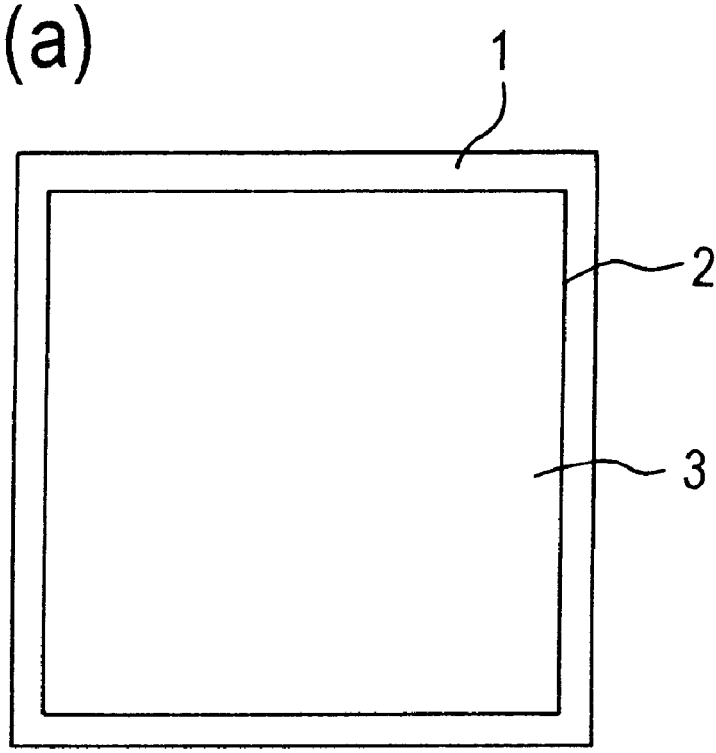
FIG. 2(*a*) and FIG. 2(*b*) are a schematic diagram showing the basic joined structure of a conventional board.
Figure 2B:
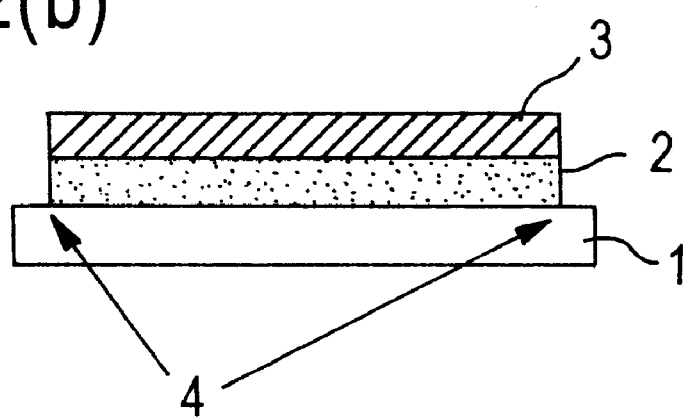

FIG. 2(a) is a diagram of a taken-off joined portion of this type of the conventional board as viewed from a direction perpendicular to the joined main plane. In this case, the interposing layer 2 does not extend from the conductor layer 3 toward the outer periphery of the board. By contrast, according to the board of the present invention, as viewed from the same direction, as shown in FIG. 3(a), the interposing layer 2 is extended from the conductor layer 3 toward the outer peripheral side of the substrate 1. In the conventional joined structure, the thermal stress created by the difference in coefficients of thermal expansion between the conductor layer 3 and the substrate 1 is concentrated on the end portion 4 of the interposing layer 2 of the board shown in FIG. 2(b) (cross-sectional view). Therefore, this portion of the ceramic is likely to be cracked. On the other hand, according to the present invention, the created thermal stress is dispersed through the interposing layer in the outward of the substrate. Therefore, the above portion of the ceramic is not substantially cracked. Further, as compared with the conventional joined structure, heat generated from the circuit of the conductor layer is more widely spread and transmitted toward the outer peripheral direction of the substrate. This can prevent the temperature of the end portion of the interposing layer from being raised, reduce the influence on the cracking of the substrate, improve heat dissipation during actual use, and reduce the thermal resistance of the whole board.

The sectional form of the side of the conductor layer may be curved and protruded outward or inward. In order to avoid the discharge phenomenon, both the side and the main plane are preferably as smooth as possible. In particularly, Rmax is preferably not more than 20 $\mu$m. For the same reason, preferably, ridges and corners of the conductor layer are free from protrusions, such as burrs, and the ridges and the corners are preferably formed so as to have a slightly curved surface.

Figure 4A:
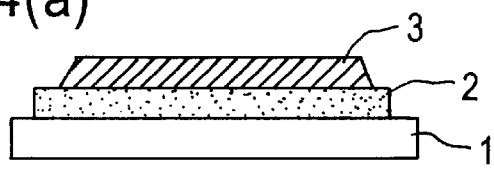
FIG. 4(*a*) and FIG. 4(*b*) are a schematic diagram showing an embodiment of the basic joined structure of the board according to the present invention.
Figure 4B:
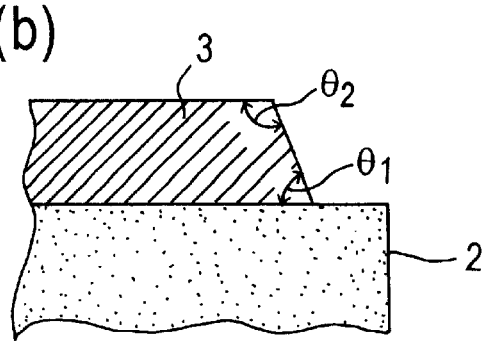
Figure 9:
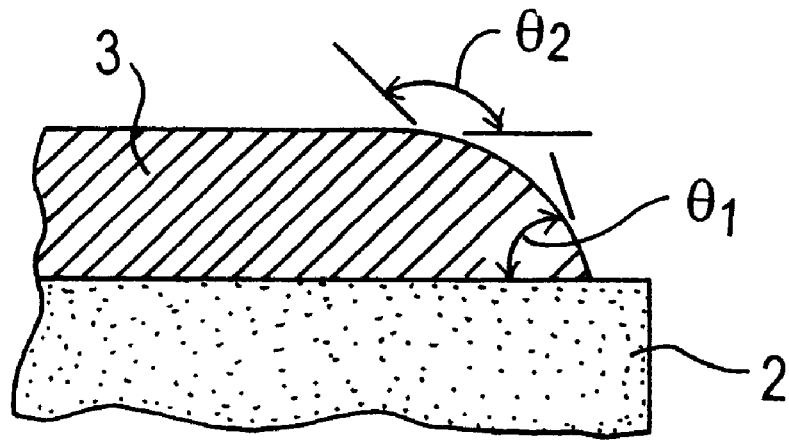
FIG. 9 is an enlarged schematic cross-sectional view showing joining between a conductor layer and an interposing layer, according to the present invention, prepared in Example 4.
Figure 10:
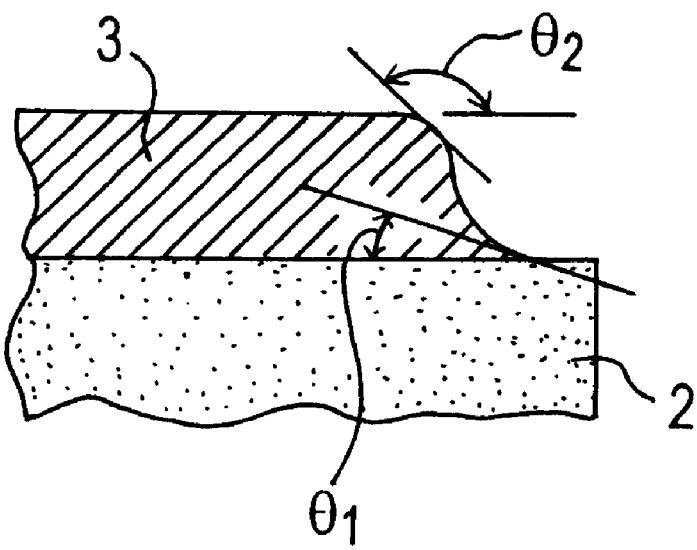
FIG. 10 is an enlarged schematic cross-sectional view showing joining between a conductor layer and an interposing layer, according to the present invention, prepared in Example 4.

The above effect of the present invention, that is, the effect of preventing the discharge phenomenon and, at the same time, preventing cracking of the ceramic substrate due to local concentration of the thermal stress, can be further improved by the structure of the above second board, that is, by bringing the angle of the outer peripheral side of the main plane of the conductor layer to the main plane of the interposing layer provided just on or under the conductor layer to not more than 80°. As described above, however, when one main plane of the conductor layer is located at the outer peripheral end of the board, the angle of this plane to the side is preferably brought to not less than 80°. The effect derived from the inclination of the side portion of the conductor layer is exerted through substantially the same mechanism as described above. The structure having a conductor layer with the side face being inclined at an angle is schematically shown in FIG. 4. FIG. 4(b) is an enlarged view of the section of the end portion in the FIG. 4(a). In the drawing, when the conductor layer 3 is provided in the middle of the laminate structure, both $\theta_1$ and $\theta_2$ are generally brought to not more than 80°. On the other hand, when the conductor layer is provided at one end of the laminate structure, in general, $\theta_1$ is brought to not more than 80°, while $\theta_2$ is brought to not less than 80°. FIGS. 9 and 10 are variants of these embodiments. In FIG. 9, the side face of the conductor layer 3 is protruded in the outer peripheral direction. On the other hand, FIG. 10, the side face of the conductor 3 is recessed.

Figure 16A:
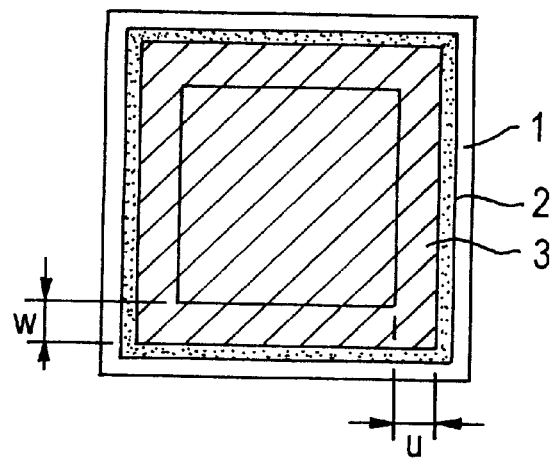
FIG. 16(*a*) and FIG. 16(*b*) are a schematic diagram showing embodiments of the formation of a conductor layer in the board according to the present invention.
Figure 16B:
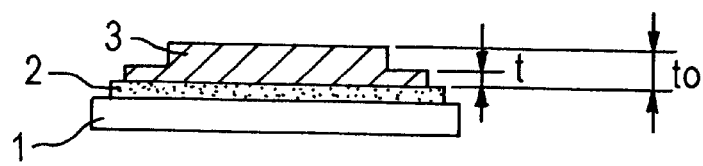

The structure of the above-described third board, that is, a structure wherein the outer peripheral side portion of the main plane of the conductor layer is step-formed, also can reduce damage to the substrate caused by the thermal stress. Further, in this case, regulation of the height (thickness) of the step in the lowermost layer and the length thereof in the planar direction (direction of the main plane) in the step-formed side position can also relax the thermal stress applied to the substrate created by thermal expansion and thermal shrinkage of the conductor layer. A structure particularly having excellent thermal cycle shock resistance can be provided, for example, by bringing the height (thickness) of the step in the lowermost layer to not more than one-third of the thickness of the whole conductor layer and, at the same time, bringing the length of the lower collar portion in the planar direction (direction of the main plane) in the same step to not less than half of the thickness of the whole conductor layer. This conductor layer may be worked into a desired form by press molding or etching. An embodiment thereof is shown in FIG. 16. The structure shown in FIG. 16 is simple and comprises only one joining unit. FIG. 16(a) is a top view of the structure as viewed from the top of the conductor layer, wherein u and w are the length in the direction of the main plane of the lower collar portion of the conductor layer. FIG. 16(b) is a cross-sectional view of FIG. 16(a), wherein $t_0$ and t are the total thickness of the conductor layer and the height of the lower step portion, receptively. In this drawing, the above dimensions preferably satisfy three requirements represented by the following inequalities: $t \leq t_0/3$, $u \geq (\frac{1}{2})t_0$, and $w \geq (\frac{1}{2}) t_0$.

According to the board of the present invention, the interposing layer may comprise a brazing material layer comprising at least one member, selected from Ag and Cu, as a main component and an active metal. The active metal contained in the brazing material is mainly a group IVa or Va element metal. A group IVa element metal is particularly preferred. This metal can markedly improve the wettability of the components of the brazing material layer with the components of the conductor layer and the high-melting metallizing layer or the like provided respectively on both sides thereof.

When the brazing material layer containing an active metal is present in the interposing layer, the interposing layer may consist of the brazing material layer alone. However, provision of a layer of a low-melting metallizing layer, comprising at least one member selected from the group consisting of Ni, Fe, and Cu, as a main component and having a melting point of 1,000° C. or below, on the brazing material layer, as compared with the case where the interposing layer consists of the brazing material alone, can further promote the relaxation of the thermal stress created due to a difference in coefficients of thermal expansion between the conductor layer and the substrate.

When the interposing layer has the above two-layer structure comprising the brazing material layer and the low-melting metallizing layer, several joining units of the basic structure may be put on top of each other or one another so as to provide a laminate of two or more units. When the number of lamination units is excessively large, the thermal stress of the interposing layer per se becomes large. Further, in this case, the provision of the interposing layer often results in lowered heat dissipation of the whole member. Since the effect of relaxing the thermal stress increases with increasing the area of the main plane of the conductor layer, in some cases, a relatively large number of joining units of the interposing layer are used. For this reason, the number of joining units of the interposing layer should be properly determined according to the area of the main plane of the conductor layer and the load during use. In general, preferably, the thickness of the brazing material layer and the metallizing layer for each joining unit of the interposing layer are generally about 3 to 50 μm and about 2 to 40 μm, respectively. A thickness of about 5 to 20 μm for both the layers in each unit is still preferred. When the thickness is less than 2 μm, a satisfactory liquid phase for joining cannot be provided particularly in the case of a single layer structure, making it difficult to provide satisfactory joining strength. On the other hand, when the thickness exceeds 40 μm, due to the interposing layer, the heat dissipation of the whole member is likely to lower. When the number of joining units of the laminate is large, the layer thickness per unit is preferably minimized within the above range.

Several types are considered for the low-melting metallizing layer provided adjacent to the brazing material layer. Examples of the general low-melting metallizing layer include one comprising at least one member, selected from Ni, Fe, and Cu as a main component and a minor amount of a low-melting auxiliary component and one comprising these main components as described above and, in addition, a minor amount of an additional auxiliary component capable of combining with the above component(s) to form an eutectic compound at a low temperature. Examples of auxiliary components usable herein include group IIIb elements, such as B, Al, and In, and group Vb elements, such as P and Sb, and Zn and Sn. The amount of the auxiliary components added is preferably not more than 10% by weight from the viewpoint of preventing significant deterioration in Young's modulus and corrosion resistance of the main component. In this case, the melting temperature should be 1,000° C. or below. In the present invention, joining is carried out at a temperature of the melting point of the metallizing layer or above. When the melting temperature is above 1,000° C., the operation temperature of the joining exceeds 1,000° C. This is likely to cause deformation of the conductor layer of copper due to softening of the conductor layer, leading to breaking of the shape of the conductor layer. The operation temperature of the joining is generally 1,000° C. or below. In this case, preferably, the low-melting metal of the interposing layer comprises Ni as a main component and a low-melting auxiliary component, and the low-melting metallizing layer is formed by plating. this method can offer the best production efficiency. In addition, it can easily regulate the thickness and hence can reduce the variation in thickness. The Ni plating is excellent particularly in corrosion resistance and adhesion. The Ni plating may have a single layer structure of an Ni—P-based layer or alternatively may have a two-layer structure comprising an Ni—B-based layer as a lower layer and an Ni—P-based layer as an upper layer.

Another joined structure, of the first board of the present invention, having a brazing material layer containing an active metal is a joined structure comprising a substrate, a high-melting metallizing layer provided on the substrate, and a brazing material layer, containing an active metal, provided on the high-melting layer. Examples of the main component in the high-melting metallizing layer provided directly on the substrate include metals, such as tungsten (W), molybdenum (Mo), tantalum (Ta), titanium (Ti), and zirconium (Zr). The high-melting metallizing layer may further comprise a glass frit, comprising various components added as a sintering aid to the ceramic sintered body as the substrate, from the viewpoint of improving the peel strength of the high-melting metallizing layer to the substrate of the ceramic sintered body. The thickness of the high-melting metallizing layer is preferably about 3 to 50 μm, still preferably about 5 to 20 μm. When the thickness is less than 3 μm, joining strength high enough for practical use cannot be provided between the substrate layer and the high-melting metallizing layer. On the other hand, when the thickness exceeds 50 μm, the substrate is likely to warp after the formation of an interposing layer of the above brazing material or the like on the high-melting metallizing layer.

When the high-melting metallizing layer is provided in the interposing layer in the board according to the present invention, the surface roughness thereof is preferably small, still preferably not more than 4 μm in terms of Ra. This permits the effect of relaxing the thermal stress applied to the substrate to be stably attained. This further reduces the variation in strength in the joined portion, resulting in improved durability to thermal cycle.

According to the third board of the present invention, the form of the conductor layer is further regulated based on the above-mentioned first and second board structures. The fundamental concept of the structure is as already described above in connection with FIG. 16.

Figure 5A:
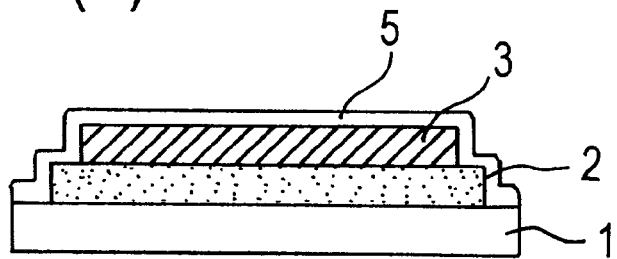
FIG. 5(*a*) and 5(*b*) are a schematic diagram showing an embodiment of the basic joined structure of the board according to the present invention.
Figure 5B:
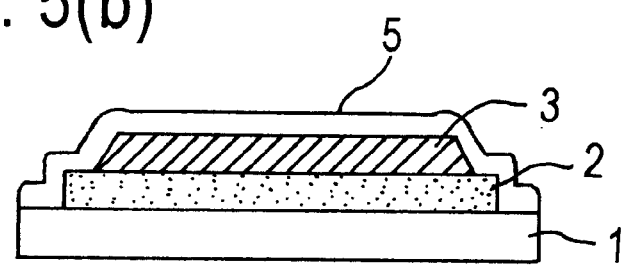

According to the fourth board of the present invention, after the above first or second board is formed, as shown in FIG. 5 (a schematic cross-sectional view of a part of the structure), an outer layer 5 comprising Ni as a main component is optionally formed on the top surface and side face of the conductor layer 3 of copper, the expose surface of the interposing layer 2 provided just under the conductor layer, and the end face of the substrate 1. The provision of the outer layer can improve the corrosion resistance of the member and at the same time can further improve the effect of relaxing the thermal stress. Specifically, the outer layer can protect the circuit of the conductor layer 3 against the environment, particularly can inhibit the progress of corrosion by moisture. Further, in addition to the above effect, the outer layer can inhibit local concentration of the thermal stress, created due to a difference in coefficients of thermal expansion between the conductor layer 3 and the substrate 1, on the joined interface of the ceramic substrate 1 and the interposing layer 2.

The formation of the outer layer 5 by plating according to a method as described above in connection with the interposing layer is preferred from the viewpoints of the production and quality. The composition of the plating may be the same as described above. Specifically, in general, the plating may have a single layer structure of an Ni—P-based layer alone or alternatively may have a two-layer structure comprising an Ni—B-based layer as a lower layer and an Ni—P-based layer as an upper layer. The thickness of the outer layer is preferably about 2 to 40 $\mu$m. When the thickness is less than 2 $\mu$m, there is a possibility that the effect of relaxing the thermal stress is unsatisfactory. On the other hand, when the thickness exceeds 40 $\mu$m, the dissipation of heat from the surface of the conductor layer is deteriorated.

In the board according to the present invention, for each lamination unit, the interposing layer may comprise a high-melting metallizing layer comprising a high-melting metal as a main component and a layer of a low-melting metal comprising at least one member, selected from the group consisting of Ni, Fe, and Cu, as a main component and having a melting point of 1,000° C. or below in that order from the substrate side. According to this joined structure, the interposing layer is free from the brazing material layer. The composition and preferred thickness of the high-melting metallizing layer provided directly on the substrate may be the same as described above. Also in this case, as described above, several joining units of the basic structure of the interposing layer may be put on top of each other or one another so as to provide a laminate of two or more units. The substrate used, embodiments of the low-melting metallizing layer provided on the high-melting metallizing layer, and several effects, such as relaxation of thermal stress, exerted by this joined structure are the same as described above.

Thus, the board of the present invention has four basic structures. Regulation of the relationship between the thickness of the ceramic substrate and the thickness of the conductor layer within a specific range can also relax the thermal stress created due to the expansion and contraction of the conductor layer caused by heat, enabling the prevention of damage to the ceramic substrate. Specifically, the thickness of the ceramic substrate and the thickness of the conductor layer are set so as to satisfy the requirement $y \geq 0.5x+0.48$ wherein y represents the thickness of the ceramic substrate, mm, and x represents the thickness of the conductor layer, mm. This can reduce the degree of warpage of the whole board when the conductor layer is provided only on the ceramic substrate or only under the ceramic substrate or when the outside dimensions of the conductor layer provided on the substrate are remarkably different from those of the conductor layer provided under the substrate. This in turn enables the board of the present invention to be joined to other component(s) by soldering or the like or to be mechanically attached to, for example, the body of a cooling system with high reliability.

The process for preparing a copper circuit-joined structure according to the present invention will be described. The preparation process comprises the steps of: (1) providing a ceramic substrate; (2) providing conductor materials (I) and/or (II), the length and width in the planar direction of the conductor materials (I) and (II) each in its portion to be directly joined to the interposing layer being at least 0.05 mm shorter than those in the planar direction of the interposing layer, the conductor material (I) being in such a form that, after joining, at least a part of the end in the planar direction of the portion not to be joined directly to the interposing layer is extended from the end of the interposing layer, the conductor material (II) being in such a form that, after joining, the portion not to be joined directly to the interposing layer in the planar direction is not extended from the end of the interposing layer; (3) selecting the materials (I) and/or (II), for each lamination unit, as a predetermined conductor layer material, disposing a material for the interposing layer between the substrate and the conductor layer material to prepare a predetermined joining unit, and then providing the joining unit by one as an joining assembly or repeatedly laminating the joining unit twice or more on top of each other or one another to prepare a joining assembly; (4) heating the assembly in the temperature range of the melting point of the component(s) of the interposing layer to below the melting point of the conductor layer material to form a joined body; and finally (5) finishing the joined body. When the conductor layer is laminated as shown in FIG. 11(a), it is possible to use a method wherein, in the step (3), a plurality of materials for the conductor layer are put on top of each other or one another. In this case, the above interposing layer of a brazing material or the like may be interposed therebetween.

The ceramic substrate may be one that conforms to the above specifications. The substrate is generally prepared, for example, by providing a powder of a main component, such as AlN, $Si_3N_4$, or $Al_2O_3$, mixing the powder with a powder of various sintering aids as described above, molding the mixed powder, sintering the compact, and finishing the sintered body to a predetermined shape. Thereafter, if necessary, the above pretreatment for accelerating the metallization, for example, the formation of an oxide layer on the surface thereof, is carried out on the surface which is to have thereon the interposing layer.

In general, the high-melting metallizing layer may be previously formed on the ceramic substrate by the following two methods. One of these methods is the so-called "post firing method" wherein a high-melting metal paste comprising the above components and, incorporated therein, an organic binder and an organic solvent is applied onto a substrate of a ceramic sintered body, prepared as described above, by printing and the coated substrate is then fired in a nonoxidizing atmosphere. The other method is the so-called "cofiring method" wherein the same high-melting metal paste as described above is applied onto a green compact of the mixed powders by printing in the course of the preparation of the substrate and the coated compact is then fired in a nonoxidizing atmosphere to sinter the ceramic and, at the same time, to form a high-melting metallizing layer. The latter method is industrially advantageous because, as compared with the former method, the latter method has lower production cost and higher strength of joining between the high-melting metallizing layer and the substrate.

In a conventional method for forming a brazing material layer, comprising at least one member selected from Ag and Cu as a main component and an active metal, on the ceramic substrate comprises the steps of: printing and applying a brazing material paste, comprising the above metals and, incorporated therein, an organic binder and an organic solvent, onto the ceramic substrate and firing the coated substrate in a vacuum of not more than $10^{-4}$ Torr. The formation method is not limited to this only, and various other methods may be used. Examples thereof include plating, coating by thermal spraying, vapor deposition, dip coating, and interposition/cladding of a foil.

However, the coating by printing is most effective from the viewpoint of layer production efficiency and ensuring quality, such as layer thickness. When the conductor layer is joined to the substrate while interposing only the brazing material layer therebetween, the formation of the brazing material layer is carried out simultaneously with the joining. Prior to the formation of the brazing material layer, a high-melting metallizing layer may be formed on the ceramic substrate by the above method. As compared with the interposition of the brazing material layer alone, additional provision of the high-melting metallizing layer can further relax the residual thermal stress created due to a difference in coefficient of thermal expansion between the conductor layer and the substrate.

In the formation of the high-melting metallizing layer, the surface roughness of the formed high-melting metallizing layer is preferably not more than 4 μm in terms of Ra.

That is, the high-melting metallizing layer functions not only to conduct general surface metallization for stable deposition of plating and flow of brazing material and formation of a circuit, but also to receive the thermal stress created due to a difference in coefficients of thermal expansion between the conductor layer comprising copper as a main component and the ceramic substrate, thereby relaxing the thermal stress that adversely affects the ceramic substrate. Further, reducing the surface roughness of the high-melting metallizing layer, preferably to not more than 4 μm in terms of Ra, can further stabilize the effect of relaxing the stress, can reduce the variation in strength of the joined portion, and particularly can improve the durability to thermal shock cycle.

Regarding the surface roughness of the high-melting metallizing layer, Japanese Patent Laid-Open No. 79290/1992 discloses an AlN board wherein the surface roughness (probably Rmax) of the high-melting metallizing layer is 0.07 μm, and Japanese Patent Laid-Open No. 40789/1996 discloses an AlN board wherein the surface roughness Ra is not more than 0.7 μm. Even when the surface of the high-melting metallizing layer is very highly flattened, however, as described above in connection with the prior art, for example, joining of the copper circuit layer comprising copper as a main component and having a large coefficient of thermal expansion onto the high-melting metallizing layer cannot provide a highly reliable joined portion. By contrast, in the present invention, in this type of the joined structure, studies have been carried out on an improvement in reliability of the high-melting metallizing layer. As a result, it has been confirmed that regulation of the surface roughness Ra of the high-melting metallizing layer to not more than 4 μm results in a lower variation in joining strength than the prior art technique, particularly an enhanced reliability in resistance to thermal shock cycle.

The surface roughness of the high-melting metallizing layer may be generally carried out as follows. Specifically, in any of the cofiring metallization and the post firing metallization, proper regulation of the wire diameter or count of mesh in a screen or the viscosity of the paste in the printing of a paste permits the regulation of the surface roughness of the high-melting metallizing layer of after firing. Reducing the wire diameter of the mesh, increasing the count of the mesh, and reducing the viscosity cani reduce the surface roughness. In this case, when the wire diameter of the mesh is excessively small, the strength is lowered, causing the wire to be likely to be elongated, which results in an increased deterioration speed in accuracy of shape of the print pattern. For this reason, the wire diameter is preferably not less than 5 μm. When the count is excessively small, clogging is likely to occur. For this reason, the mesh size is preferably not more than 500 mesh. When the viscosity of the paste is excessively low, blurring is likely to occur, leading to a deterioration in accuracy of shape of the print pattern. Therefore, the viscosity of the paste is preferably not less than 50 ps. The viscosity may be modified by the amount of the organic binder or the solvent added. This permits the surface smoothness to be regulated to some extent.

In order to further enhance the leveling property from the viewpoint of providing a high-melting metallizing layer having a surface roughness Ra of not more than 4 μm, for example, use of a starting powder with the amount of coarse particles being minimized for the purpose of reducing surface irregularities, optional incorporation of an appropriate amount of a powder having a different particle diameter for the purpose of reducing large waviness and the like are effective. The mixing procedure is preferably such that the solvent and the organic binder are satisfactorily dispersed by applying ultrasonic vibration or in a ball mill and a powder composition as a starting material is then gradually added thereto by portions. This is because addition of the solvent and the organic binder to the powder composition is likely to cause aggregation of the powder composition, resulting in lowered leveling property at the time of printing of the paste.

According to another joined structure of the present invention, a metallizing layer comprising as a main component at least one member selected from Ni, Fe, and Cu and having a melting point of 1,000° C. or below is formed on the high-melting metallizing layer or the brazing material layer. Various methods are considered for the formation of this metallizing layer. Examples thereof include plating, thermal spray coating, vapor deposition, dip coating, and interposition cladding of a foil. When, like interposition cladding of a foil, a metallic material is interposed to conduct joining, a foil of a metal having the above composition is interposed between a joining surface of a material for the conductor layer and the substrate on its surface with the high-melting metallizing layer or the brazing material layer being formed thereon, followed by joining according to hot cladding or other method to prepare a composite material. On the other hand, in the case of the formation of this layer by plating, thermal spray coating, vapor deposition, dip coating or the like, the contemplated layer is previously formed on the joining surface of any one of or both the materials, and both the materials are then heat-treated to conduct joining, thereby preparing the board of the present invention. The heating treatment is carried out at a temperature ranging from the melting point of the metallizing layer to below the melting point of the material for the conductor layer in a nonoxidizing atmosphere.

The heat treatment temperature is generally 1,000° C. or below. When the temperature is the melting point of the conductor layer or above, the outer peripheral shape of the conductor layer and the formed circuit pattern are likely to be broken. In this case, the final layer thickness is preferably about 2 to 40 μm. When the thickness is less than 2 μm, it is difficult to ensure the amount of a liquid phase large enough for joining, causing a part of the joined body to have low joining strength. On the other hand, when the thickness exceeds 40 μm, heat dissipation through the interposing layer is often lowered.

In the present invention, there are several methods, as described above, for the formation of the metallizing layer comprising as a main component at least one member selected from the group consisting of Ni, Fe, and Cu. When the productivity of the metallizing layer is taken into consideration, plating has the highest efficiency and can ensure layer quality such as thickness. In this case, a plating comprising Ni as a main component is preferred particularly from the viewpoints of corrosion resistance and adhesion. In the case of the Ni plating, the plating may have a single layer structure of an Ni—P-based material or alternatively may have a two-layer structure comprising an Ni—B-based layer and an Ni—P-based layer provided thereon. The plating may be carried out by any of electroplating and electroless plating.

The material for the conductor layer is as described above. The material is generally in a sheet form. For the size of the sheet as the material for the conductor layer, the outside size is previously rendered not less than 0.05 mm shorter for both length and width than the contemplated outside dimensions of the main plane of the interposing layer to be provided just above or under the conductor layer. The size of about 0.05 to 1 mm shorter than the outside dimension of the interposing layer is particularly preferred. The reason why the size is rendered not less than 0.05 mm shorter than the outside dimension of the interposing layer is, as described above, to relax concentration of thermal stress created between the substrate and the conductor layer on a part of the substrate and to prevent damage to the substrate at the time of uniting of both materials and upon application of heating and cooling load during practical use of the board. The shape of the side face and the main plane thereof, the degree of surface finishing, and the effects expected thereby are as described above. Any conventional sheet forming method may be used for the formation. The circuit pattern of the conductor layer is generally formed by etching after joining. When provision of an angle or a difference in level like a step on the side face of the conductor layer in the board according to the present invention, the shape of the side face and the main plane and the degree of surface finishing may be the same as those described above. Further, as described above, regulation of the relationship between the thickness of the conductor layer and the thickness of the substrate so as fall within a given range can further improve the contemplated effect of the present invention.

The joining assembly is then joined by heating. When the interposing layer present on the surface to be finally joined consists of the brazing material layer alone, the joining assembly is heated in the temperature range of the melting point of the brazing material layer to below the melting point of the conductor layer in a vacuum of not more than $10^{-4}$ Torr. On the other hand, when a low-melting metallizing layer comprising as a main component at least one member selected from the group consisting of Ni, Fe, and Cu and having a melting point of 1,000° C. or below is formed on the brazing material layer and the high-melting metallizing layer simultaneously with joining of the assembly, heating is conducted in the temperature range of the melting point of the low-melting metallizing layer to below the melting point of the conductor layer in a non-oxidizing atmosphere. At the time of this joining, in order to prevent shifting of mutual position between the conductor layer and the substrate, if necessary, a jig made of a material, for example, a refractory, such as a carbonaceous, alumina, or aluminum nitride refractory, is used for fixation, thereby preventing the shifting of mutual position. Further, in order to prevent such shifting and to ensure peel strength level, after joining, high enough for practical use, if necessary, a proper load may be applied from the top to surely conduct the fixation and to ensure satisfactory strength after joining.

According to the fourth board of the present invention, a layer comprising as a main component Ni is formed as the outermost layer of the first, second, or third board prepared above. In this case, in principle, the layer comprising Ni as a main component is formed by the above method on the top and side faces of the conductor layer, the exposed surface of the interposing layer provided just under the conductor layer, and the exposed main plane of the substrate. FIG. 5 is a schematic diagram showing a taken-off portion of the section after the formation of the outer layer. The face to be formed may vary depending upon the structure of the final semiconductor device. As described above, the outer layer is preferably formed by plating from the viewpoints of productivity and quality. Further, as described above, the formation of the outer layer on the outermost layer can improve the corrosion resistance of the board and at the same time can promote the relaxation of the thermal stress as compared with the case where the outer layer is not formed.

Figure 6:
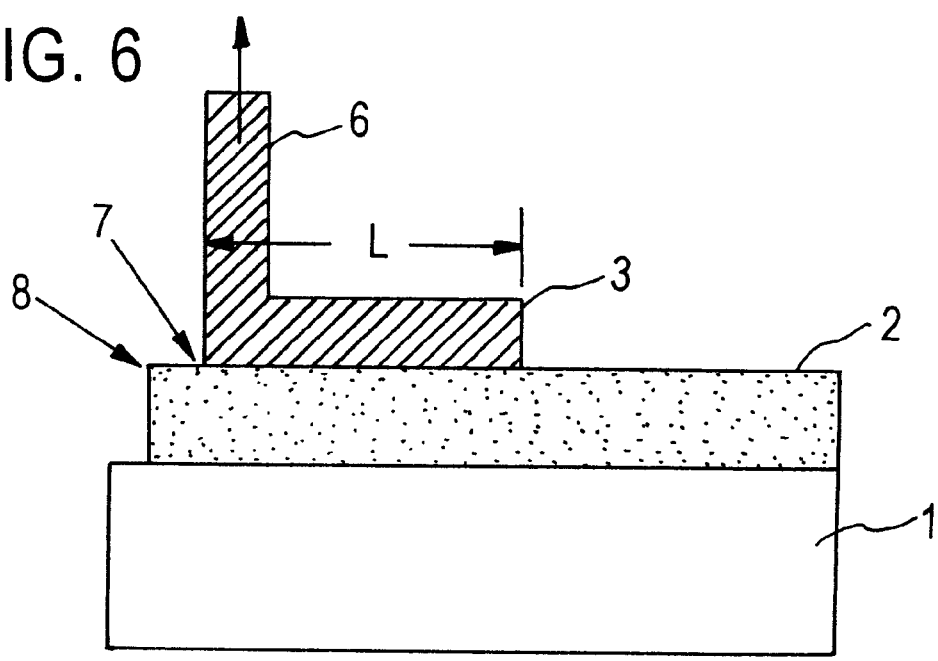
FIG. 6 is a diagram illustrating a method for measuring the peel strength of a joined portion of the board according to the present invention.

The peel strength of the joined portion in the copper circuit-joined board, according to the present invention, having the above joined structure is on a high level of not less than 0.5 kg/mm which poses no problem in practical use. The strength on the above high level can be stably provided. The peel strength may be measured as follows. In FIG. 6, a conductor layer 3 having a thickness of 0.1 mm and a width of 4.0 mm is joined in a length L of 3 mm on a ceramic substrate 1 through an interposing layer 2. In this case, a grip portion 6 is formed in the conductor layer by folding the conductor layer material at a right angle to the joined portion. In the grip portion 6, the length defined by the end 7 of the grip portion 6 and the end 8 of the interposing layer 2 is brought to a predetermined value. Thereafter, the grip portion 6 of the conductor layer 3 is grasped with the joined body being fixed and then pulled upward to measure the peel strength. In this case, a tensile load, under which a part of the joined layer including the conductor layer or the joined interface thereof begins to be peeled, is expressed in terms of the value per mm of L which is regarded as the peel strength value.

EXAMPLES

Example 1

An AlN powder, an $Si_3N_4$ powder, and $Al_2O_3$ powder each having an average particle diameter of 1 μm were provided as main component powders. Further, a $Y_2O_3$ powder having an average particle diameter of 0.6 μm and a CaO powder having an average particle diameter of 0.3 μm were provided as sintering aid powders. 97% by weight of one of the three kinds of main component powders and a sintering aid powder of a combination of 1.5% by weight of the $Y_2O_3$ powder with 1.5% by weight of the CaO powder were weighed and mixed together in an ethanol solvent in a ball mill for 24 hr. Thus, three kinds of mixed powders, that is, an AlN mixed powder containing $Y_2O_3$—CaO as a sintering aid, an $Si_3N_4$ mixed powder containing $Y_2O_3$—CaO as a sintering aid, and an $Al_2O_3$ mixed powder containing $Y_2O_3$—CaO as a sintering aid were obtained. 10 parts by weight of PVB (polyvinyl butyral) as a binder was added to 100 parts by weight of each mixed powder to prepare slurries. A part of each of the slurries was spray dried to prepare granules which were then molded by means of a powder molding press to prepare a compact comprising AlN as a main component, a compact comprising $Si_3N_4$ as a main component and a compact comprising $Al_2O_3$ as a main component. The compact comprising AlN as a main component and the compact comprising $Si_3N_4$ as a main component were sintered in a nitrogen atmosphere at 1,700° C. for 5 hr. On the other hand, the compact comprising $Al_2O_3$ as a main component was sintered in the air at 1,600° C. for 5 hr. Thus, sintered bodies having a size of a thickness of 0.7 mm and a length and a width specified in Table 1 were prepared. It should noted that all sintered bodies comprising silicon nitride as a main component prepared herein and referred to in tables below belong to the conventional silicon nitride sintered body, unless otherwise specified. The content of oxygen in the crystal grain of the sintered body was determined by Auger electron spectroscopy/XPS and found to be 10% by weight. For all the sintered bodies comprising respective materials thus prepared, the relative density (the proportion of the density measured by the submerging method by presuming the theoretical density to be 100%) was not less than 99%, and the surface was free from defects, such as voids, that pose a problem in practical use. Further, for these sintered bodies, the thermal conductivity were measured by a laser flash method, and the three-point flexural strength was measured according to JIS. As a result, the thermal conductivity and the flexural strength were respectively 150 to 160 W/m·K and 400 to 450 MPa for the AlN sintered body, respectively 50 to 60 W/m·K and 600 to 700 MPa for the $Si_3N_4$ sintered body, and respectively 30 to 40 W/m·K and 450 to 500 MPa for the $Al_2O_3$ sintered body.

Separately, substrate samples A and B each comprising the above high-thermal conductivity silicon nitride ceramic and having a length of 25 mm, a width of 25 mm, and a thickness of 0.5 mm (not described in Table 1) were provided. The sample A was a silicon nitride sintered body, of β crystal phase, containing about 5% by weight in terms of an oxide of Yb and about 5% by weight in terms of an oxide of Y as auxiliary components, having a content of oxygen in the crystal of about 6% by weight, and having a relative density of 99%. The sample A had a thermal conductivity of 100 W/m·K and a three-point flexural strength of 800 MPa. On the other hand, the sample B was a silicon nitride sintered body, of β crystal phase, containing about 8% by weight in-terms of an oxide of Sm and about 2% by weight in terms of an oxide of Ca as auxiliary components, having a content of oxygen in the crystal of about 3% by weight, and having a relative density of 99%. The sample B had a thermal conductivity of 130 W/m·K and a three-point, flexural strength of 900 MPa. The surface of these ceramic samples was free from defects, such as voids, that pose a problem in practical use. The content of the auxiliary components in the sintered bodies was determined by induction emission spectroscopy, the content of oxygen in the crystal grain of the sintered body was determined by Auger electron spectroscopy/XPS, and the crystal phase was confirmed by X-ray diffractometry.

Next, four active metal brazing material pastes were provided: an active metal silver brazing material paste comprising 100 parts by weight of a powder, with an average particle diameter of 5 µm, and composed mainly of 78% by weight of Ag and 22% by weight of Cu (13Ag–8Ag brazing material specified in JIS) and, added thereto, 3 parts by weight of a Ti powder having an average particle diameter of 0.5 µm; an active metal silver brazing material paste comprising 100 parts by weight of a powder, with an average particle diameter of 5 µm, and composed mainly of 78% by weight of Ag and 22% by weight of Cu (13Ag–8Ag brazing material specified in JIS) and, added thereto, 3 parts by weight of a Zr powder having an average particle diameter of 0.5 µm; an active metal silver brazing material paste comprising 100 parts by weight of a powder, with an average particle diameter of 5 µm, and composed mainly of 78% by weight of Ag and 22% by weight of Cu (13Ag–8Ag brazing material specified in JIS) and, added thereto, 3 parts by weight of a V powder having an average particle diameter of 0.5 µm; and an active metal copper brazing material paste comprising 100 parts by weight of a powder, with an average particle diameter of 5 µm, and composed mainly of 15% by weight of Ag, 5% by weight of P, and 80% by weight of Cu (BCup5 copper brazing material specified in JIS) and, added thereto, 3 parts by weight of a Ti powder having an average particle diameter of 0.5 µm. These brazing material pastes were applied by screen printing over substantially the whole surface of the main plane (plane in the lengthwise and widthwise directions) of the respective sintered bodies, followed by firing to form brazing material layers. In this case, in order to prevent the brazing material layer from being extended from the coating face or from entering the side face at the time of printing, the size of the print pattern was rendered about 0.3 mm shorter in both ends of the substrate in both the lengthwise and axial directions of the substrate. Combinations of substrate with brazing materials used were as specified in Table 1. The brazing material layer was formed by degassing the paste-coated sintered body at 600° C.

Figure 12:
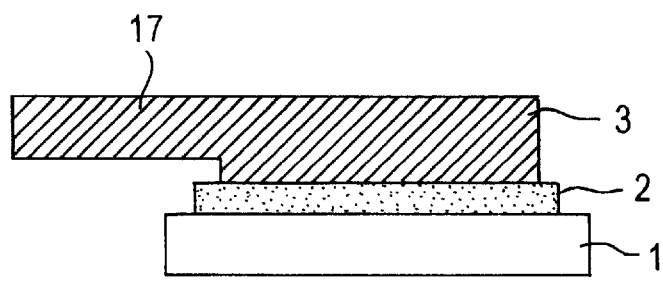
FIG. 12 is a schematic diagram showing an embodiment of the basic joined structure of the board according to the present invention.

For each sample, a material for a conductor layer having a difference in main plane dimensions (length and width) from the main plane of the interposing layer as specified in Table 1 was punched out by means of a punching press. The material used was a 0.3 mm-thick electrolytic copper sheet specified in JIS C1020. The dimensions described in the column of size difference in Table 1 is a value of "(outside dimension of the main plane of the interposing layer)— (outside dimension of the main plane of the conductor layer)." The difference in the lengthwise direction is identical to the difference in the widthwise direction, and the difference is expressed in terms of ΔL. The dimension ΔX described in the column of size difference in Table 1 is the maximum protrusion length (the dimension in the longitudinal direction in the protruded portion) of the conductor layer extended, after joining, from the interposing layer toward the widthwise (lateral) direction of the substrate. (supported by the values shown in Table 1. Not all the values of ΔX are 10 mm, as shown in Table 1). The width of the protruded portion (dimension in the lateral direction in the protruded portion) was the same as that of the joined portion. The side face of the material for the conductor layer was provided at a right angle to the main plane. For all ridges where the main plane crosses the top of the side face, a round portion was formed at a radius of curvature of 0.5 mm. The sectional structure is schematically shown in FIG. 12.

Next, among specimens, wherein an interposing layer has been formed on the substrate, ten specimens were selected for each sample. A material for the conductor layer was put on the interposing layer of each specimen to prepare a joining assembly. Each assembly was set on a setter made of graphite and fired in a nitrogen atmosphere at 780° C. for 30 min. Thus, the whole assembly was joined without applying any load from the top. For all the joined assemblies, after the joining, the thickness of the interposing layer was within 10±1 µm. Also for the above-described samples of the substrates A and B prepared using the high-thermal conductivity silicon nitride ceramic, respective joined circuit boards confirming to the specifications of sample 12 in Table 1 were prepared according to the above procedure. For sample Nos. 9 and 10, the end of the conductor layer was previously extended from the end of the interposing layer provided just under the conductor layer in the joined interface of the conductor layer and the interposing layer. For sample No. 9, as shown in FIG. 1(a), the conductor layer was extended from the interposing layer in the widthwise direction. For sample 10, as shown in FIG. 1(b), the conductor layer was extended aslant from the interposing layer.

Next, regarding assemblies which had been separately joined in the same manner as described above (including those using the substrates A and B), 10 specimens were selected for each sample. The whole joined portion was ultrasonically inspected, by means of an ultrasonic detector having an image processing function, for defects in the joined portion. Specifically, the whole upper main plane of the conductor layer for each sample was scanned by means of a probe, and the intensity level of the wave reflected from each layer in the joined portion was subjected to color code image processing. In this case, several reference specimens of interposing layers of the same peripheral size with cavities of various sizes being previously formed therein were prepared. From the correlation between the size level of the cavity and the intensity level (peak height) of the reflected wave, the defect level was numerated and color-coded for use as reference for image processing. By this method, the defect reflection wave level of ultrasonic waves sent from the conductor layer side was confirmed as the distribution pattern over the whole surface, and the proportion of the area of the defect portion to the whole joined face was confirmed. As a result, for all the samples, a reflection pattern of an abnormal level considered attributable to the defection portion was not substantially confirmed. The proportion of the area of the portion considered to be the defect portion was not more than 10%. Individual areas are very small and are such that no problem occurs in practical use. Further, two specimens for an identical sample were selected. A section containing a portion where slight defect reflection wave was confirmed, was taken off, and the periphery of the joined portion within the section was observed under SEM (a scanning electron microscope) at a magnification of 1,000 times. As a result, very small pinholes were found here and there in the interface and portions around the interface. However, any defect, which poses a problem in practical use, was not found.

The remaining 8 samples were subjected to a heat cycle test wherein a series of cooling and heating steps, that is, holding at 0° C. for 15 min and holding at 100° C. for 15 min, were repeated ten times. Thereafter, the analysis of the surface of the joined portion by ultrasonic inspection and the observation of the magnified section of the joined portion were carried out in the same manner as described above.

As a result, a group of specimens for sample Nos. 2 and 3, the surface analysis by ultrasonic inspection has revealed that, while the percentage defect area before the test was 5 to 8%, the percentage defect area after the test was increased to 10 to 20%. For these samples, as a result of the obser vation of the magnified section of a portion containing defects, it was found that very small defects are present in the substrate in its portion around the joined interface of the interposing layer and the substrate. On the other hand, for samples of the present invention including those using the substrates A and B, an increase in the defect area after the test was not found.

For each sample, 20 specimens were selected to examine the peel strength of the conductor layer and the degree of warpage of the member. The results are given in Table 1. The peel strength of the conductor layer was determined by the method, as described above, shown in FIG. 6. The degree of the warpage of the member was determined as follows. The sample was put on a surface plate with the main plane facing upward, and a dial gauge was scanned in two diagonal directions of the main plane of the sample to determine the difference in between the maximum height from the surface plate and the minimum height from the surface plate. This difference value was divided by the length of the diagonal to determine a value per mm of the diagonal. For samples using the substrate samples A and B (not given in the table), the results were the same as those for sample 13, in Table 1, which was the same assembly as the samples using the substrate samples A and B except for the substrate thickness.

Next, for the same samples, an AC voltage of 1,000 V was applied for 10 min in the thicknesswise direction of the board, and this voltage application was repeated five times to examine the puncture voltage between the conductor layer and the substrate. The board was inspected for a deterioration in the puncture voltage by the application of the voltage as compared with that before the application of the voltage. The results are given in the column of puncture strength in Table 1. As is apparent from the data, the deterioration in the puncture voltage after the initial voltage application for 10 min was found for samples wherein the length and width of the main plane of the conductor layer were larger than those of the interposing layer provided just under the conductor layer, and for samples wherein the end of the conductor layer was extended from the end of the interposing layer (in this case, this evaluation result was indicated by X in the same column; the same shall apply hereinafter). For samples wherein the end of the conductor layer was not extended from the end of the main plane of the interposing layer and ΔL described in Table 1 was less than +0.05 mm, the deterioration in the puncture voltage was found after the completion of the third voltage application (in this case, this evaluation result was indicated by Δ in the same column; the same shall apply hereinafter). By contrast, for samples of the present invention wherein the end of the conductor layer was not extended from the end of the main plane of the interposing layer and ΔL was not less than +0.05 mm (including samples using the substrate samples A and B), no deterioration was found (in this case, this evaluation result was indicated by ○ in the same column; the same shall apply hereinafter). The deterioration in puncture means that puncture occurred at a voltage below the above voltage after the application of the above voltage.

TABLE 1

| No. | Substrate Material | Substrate Size (mm) | Material for interposing layer | Conductor layer Size difference (mm) ΔL | Conductor layer Size difference (mm) ΔX | Conductor layer Shifting extending | Peel strength of conductor layer (kg/1 mm) | Warpage of substrate (μm/mm) | Puncture strength |
|---|---|---|---|---|---|---|---|---|---|
| *1 | AlN | 25 | Ag(Ti) | −0.03 | 10 | Present | 0.3 ~ 0.4 | 1.8 ~ 2.0 | X |
| *2 | " | " | " | 0 | " | Absent | 0.4 ~ 0.6 | 1.8 ~ 2.1 | Δ |
| *3 | " | " | " | +0.03 | " | " | 0.4 ~ 0.8 | 1.7 ~ 2.0 | Δ |
| 4 | " | " | " | +0.05 | " | " | 0.9 ~ 1.2 | 1.8 ~ 2.2 | ○ |
| 5 | " | " | " | +0.5 | " | " | 0.9 ~ 1.3 | 1.8 ~ 2.0 | ○ |
| 6 | " | " | " | +1.0 | " | " | 0.9 ~ 1.3 | 1.9 ~ 2.0 | ○ |
| 7 | " | " | " | +1.2 | " | " | 0.8 ~ 1.4 | 1.6 ~ 2.0 | ○ |
| 8 | " | " | " | +2.0 | −2.0 | " | 0.9 ~ 1.4 | 1.8 ~ 2.2 | ○ |
| *9 | " | " | " | +0.5 | 10 | Widthwise direction | 0.4 ~ 0.6 | 1.7 ~ 2.1 | X |
| *10 | " | " | " | +0.5 | " | Aslant | 0.4 ~ 0.6 | 1.8 ~ 2.0 | X |
| *11 | $Si_3N_4$ | " | " | 0 | " | Absent | 0.4 ~ 0.6 | 1.8 ~ 2.1 | Δ |
| 12 | " | " | " | +0.05 | −0.05 | " | 0.7 ~ 0.8 | 1.8 ~ 2.0 | ○ |
| 13 | " | " | " | +1.0 | " | " | 0.8 ~ 1.0 | 1.9 ~ 2.0 | ○ |
| *14 | $Al_2O_3$ | " | " | 0 | " | " | 0.3 ~ 0.5 | 1.6 ~ 2.0 | Δ |
| 15 | " | " | " | +0.05 | " | " | 0.6 ~ 0.9 | 1.8 ~ 2.1 | ○ |
| 16 | " | " | " | +1.0 | −1.0 | " | 0.8 ~ 1.0 | 1.8 ~ 2.2 | ○ |
| 17 | AlN | " | Ag(Zr) | +1.0 | 10 | " | 0.8 ~ 1.0 | 1.7 ~ 2.3 | ○ |
| 18 | " | " | Ag(V) | +1.0 | " | " | 0.9 ~ 1.0 | 1.8 ~ 2.1 | ○ |
| 19 | " | " | Cu(Ti) | +1.0 | " | " | 0.9 ~ 1.2 | 1.6 ~ 2.0 | ○ |
| 20 | " | 50 | Ag(Ti) | +1.0 | " | " | 0.8 ~ 1.3 | 2.0 ~ 2.4 | ○ |
| 21 | " | 100 | Ag(Ti) | +1.0 | −1.0 | " | 0.9 ~ 1.4 | 2.0 ~ 2.5 | ○ |

Example 2

Three kinds of compacts of an AlN-based material, an $Si_3N_4$-based material, and an $Al_2O_3$-based material (except for high-thermal conductivity silicon nitride ceramic) were prepared using the same starting materials, mixing formulation, and mixing/molding procedures as described in Example 1. Half of these compacts were selected, and a high-melting metal paste comprising a high-melting metal W as a main component and an $SiO_2$—CaO—$B_2O_3$ glass was applied by printing on one main plane of the compacts, followed by firing in a nitrogen atmosphere at 1,600° C. for 5 hr to sinter each compact body and at the same time to sinter the high-melting metal paste. In this case, as with Example 1, the high-melting metallizing layer was formed over substantially the whole surface of the ceramic substrate. The weight ratio of the high-melting metal in the high-melting metallizing layer to the glass was 85:15. The glass had a composition comprising, in terms of weight ratio, $SiO_2$ 40, CaO 30, and $B_2O_3$ 30. The samples thus prepared were described as CF (abbreviation for "cofiring method") in the column of the preparation process in Table 2.

The remaining half of the compacts were sintered in the same manner as in Example 1 for each ceramic composition. Thereafter, the above high-melting metal paste was applied by printing on one main plane of the sintered body, followed by firing in a nitrogen atmosphere at 1,600° C. for one hr to form a high-melting metallizing layer. The samples thus prepared were described as PF (abbreviation for "post firing") in the column of the preparation process in Table 2. The area of the formation of the high-melting metallizing layer and the composition ratio of the high-melting metal component to the glass component in the high-melting metallizing layer were the same as described above.

For all the substrates prepared by the cofiring method and the post firing method, regarding the outside dimensions, the length and the width were 50 mm and 0.7 mm, respectively. The thickness of the high-melting metallizing layer was 20±1 μm. The surface roughness Ra of the high-melting metallizing layer was measured with a contact type surface roughness meter and found to be not more than 4 μm for all the samples. The tip of the roughness meter was a probe of R=5 μm, and the cut-off was 0.8 mm. On the main plane having thereon the high-melting metallizing layer was formed an about 10 μm-thick Ni—P plating having substantially the same outside dimensions as the main plane. Thus, an interposing layer composed of a high-melting metallizing layer as a first layer and an Ni—P plating layer as a second layer were formed. Thereafter, a conductor layer prepared using the same material and thickness as in Example 1 in the same manner as in Example 1 was previously worked so that, in both the lengthwise and widthwise direction, the size of the conductor layer is ΔL (as specified in Table 2) shorter than the size of main plane of the interposing layer. The dimension ΔX described in the column of size difference in Table 2 is the maximum protrusion length (the dimension in the longitudinal direction in the protruded portion) of the conductor layer extended from the interposing layer toward the widthwise (lateral) direction of the board. For all the samples, the ΔX value was 10 mm. The width of the protruded portion (dimension in the lateral direction in the protruded portion) was the same as that of the joined portion. The angle of the main plane to the side face in the conductor layer and the roundness of the ridge were the same as those in Example 1. For several samples (not given in Table 2), a 2 μm-thick Ni—P plating layer was formed over the whole area of the joining face.

Subsequently, the conductor layer in its joining face was put on the main plane of the Ni—P plating layer on the substrate side with the interposing layer formed thereon to prepare joining assemblies which were then fired in a nitrogen atmosphere at 900° C. for 30 min under joining conditions as used in Example 1. Thus, board samples were prepared. The board samples thus prepared were evaluated for the same items as in Example 1. At the outset, the peel strength of the conductor layer, the degree of warpage of the member, and the puncture strength were evaluated in the same manner as in Example 1. The results are given in Table 2. Further, the section of the board was magnified and observed. As a result, it was found that irregularities in the joined interface of the high-melting metallizing layer and the Ni plating layer were within 10 μm in terms of the difference between the maximum height and the minimum height (corresponding to Rmax in surface roughness). This corresponds to not more than 3 μm in Ra. The indication of the level of the puncture strength in the table is the same as described in Example 1. The peel strength value for the sample wherein the plating layer was previously formed on both the substrate side and the conductor layer side (not given in the table) was about 6% larger than that (a value given in the table) of the sample wherein the plating layer was formed on the substrate side only. Further, these samples were subjected to a heat cycle test in the same manner as in Example 1. Before and after the test, the samples were analyzed by ultrasonic inspection and observed in its joined portion in a magnified state. As a result, for all the samples except for sample Nos. 22 and 23, any defect, which poses a problem in practical use, was not found in the joined portion and portions around the joined portion, both before and after the heat cycle test. From the data in the same table, it is apparent that the peel strength of the samples wherein the high-melting metallizing layer was formed by the cofiring method, was larger than that of the samples wherein the high-melting metallizing layer was formed by the post firing method. Also for the resistance to heat cycles, it was confirmed that the former samples were superior to the latter samples.

A sample having a high-melting metallizing layer comprising Mo or Ta as a main component was prepared in the same manner as described above and evaluated in the same manner as described above. As a result, the evaluation results were substantially the same as those in the samples having the high-melting metallizing layer comprising W as a main component.

substrate. The composition, thickness and the like of the interposing layer were as given in Table 3. For the high-thermal conductivity silicon nitride ceramic materials A and B, circuit boards having a interposing layer/conductor layer structure according to sample 46 in Table 3 were prepared. When the interposing layer consisted of the brazing material layer alone, the joining interposing layer and the conductor layer were formed in the same manner as in Example 1, when the interposing layer comprised a first layer of a high-melting metallizing layer and a second layer comprising as a main component Ni, Cu, or Fe, the joining interposing layer and the conductor layer were formed in the same manner as in Example 2. For all the substrates except for the high-thermal conductivity silicon nitride ceramic substrates, the outside dimensions were such that the length was 50 mm, the width was 50 mm, and the thickness was 0.7 mm. The high-melting metallizing layer was formed by the cofiring method so that the surface roughness Ra was not more than 3 μm. For all the samples, the material and the thickness of the conductor layer were the same as those described in Example 1. Further, for all the samples, the difference in size between the main plane of the conductor layer and the main plane of the interposing layer, that is, ΔL, was +1.0 mm in both the lengthwise and widthwise directions. The samples thus prepared were evaluated for the same items as described in Example 1. The evaluation results of all the samples except for the samples using the substrate samples A and B are given in Table 3. For the samples using the substrate samples A and B, the evaluation results were substantially the same as those for sample No. 46. As a result of ultrasonic inspection and observation of

TABLE 2

| | Substrate | | Interposing layer | | | | Peel | | |
| | | | Main component of 1st | Material for | Size difference (mm) | | Shifting Extend- | strength of conductor layer | Warpage of board | Puncture |
| No. | Material | Preparation process | layer | 2nd layer | ΔL | ΔX | ing | (kg/1 mm) | (μm/mm) | strength |
|---|---|---|---|---|---|---|---|---|---|---|
| *22 | AlN | CF | W | Ni—P plating | −0.03 | 10 | Present | 0.3 ~ 0.5 | 1.9 ~ 2.3 | X |
| *23 | " | " | " | " | 0 | " | Absent | 0.4 ~ 0.7 | 1.8 ~ 2.1 | Δ |
| 24 | " | " | " | " | +0.05 | " | " | 2.3 ~ 2.6 | 1.7 ~ 2.1 | ○ |
| 25 | " | " | " | " | +0.5 | " | " | 2.4 ~ 2.9 | 1.8 ~ 2.2 | ○ |
| 26 | $Si_3N_4$ | " | " | " | +1.0 | " | " | 2.9 ~ 3.1 | 1.7 ~ 2.3 | ○ |
| 27 | $Al_2O_3$ | " | " | " | +2.0 | " | " | 2.9 ~ 3.0 | 1.8 · 2.1 | ○ |
| 28 | AlN | PF | " | " | +0.05 | " | " | 1.0 ~ 1.6 | 1.7 ~ 2.1 | ○ |
| 29 | $Si_3N_4$ | " | " | " | +0.5 | " | " | 1.3 ~ 1.9 | 1.6 ~ 2.2 | ○ |
| 30 | $Al_2O_3$ | " | " | " | +1.0 | " | " | 1.6 ~ 1.8 | 1.7 ~ 2.2 | ○ |

In the table, mark * represents Comparative Example.

Example 3

Four kinds of ceramic substrates of the same materials and combinations as described in Example 1 were prepared (including high-thermal conductivity silicon nitride ceramic substrate samples A and B having a smaller thickness of 0.5 mm which is different from the thickness of the other three kinds of substrates as provided in Example 1). As with Example 1, the main plane of the interposing layer had substantially the same shape as the main plane of the the section, it was found that all the samples were free from any defect which poses a problem in practical use. From the above results, it is apparent that regulation of the thickness of each of the high-melting metallizing layer and the brazing material layer in the interposing layer within the range of 3 to 50 μm and regulation of the thickness of the second interposing layer within the range of 2 to 40 μm are preferred from the viewpoint of the peel strength, warpage of the member, and the resistance to heat cycling load.

TABLE 3

| No. | Substrate Material | Preparation process | Interposing layer (thickness in μm) 1st layer Material | Thickness | 2nd layer Material | Thickness | Peel strength of conductor layer (kg/1 mm) | Warpage of board (μm/mm) | Puncture strength |
|---|---|---|---|---|---|---|---|---|---|
| 31 | AlN | PF | Ag(Ti) | 2 | — | — | 0.8 ~ 0.9 | 0.4 ~ 0.6 | ○ |
| 32 | " | " | " | 3 | — | — | 0.9 ~ 1.2 | 0.8 ~ 0.9 | ○ |
| 33 | " | " | " | 5 | — | — | 0.9 ~ 1.3 | 0.9 ~ 1.2 | ○ |
| 34 | " | " | " | 20 | — | — | 0.9 ~ 1.4 | 0.9 ~ 1.3 | ○ |
| 35 | " | " | " | 30 | — | — | 1.0 ~ 1.3 | 1.0 ~ 1.2 | ○ |
| 36 | " | " | " | 40 | — | — | 1.1 ~ 1.3 | 1.5 ~ 1.8 | ○ |
| 37 | " | " | " | 50 | — | — | 1.1 ~ 1.3 | 2.6 ~ 2.8 | ○ |
| 38 | " | " | " | 55 | — | — | 0.8 · 1.0 | 2.6 ~ 2.8 | ○ |
| 39 | " | " | W | 2 | Ni—P plating | 5 | 1.1 ~ 1.3 | 0.9 ~ 1.2 | ○ |
| 40 | " | " | " | 5 | " | 5 | 1.2 ~ 1.4 | 1.0 ~ 1.2 | ○ |
| 41 | " | " | " | 20 | " | 5 | 1.3 ~ 1.4 | 1.5 ~ 1.8 | ○ |
| 42 | " | " | " | 40 | " | 5 | 1.4 ~ 1.6 | 2.5 ~ 2.6 | ○ |
| 43 | " | " | " | 50 | " | 5 | 1.6 ~ 1.8 | 2.6 ~ 2.8 | ○ |
| 44 | " | " | " | 55 | " | 5 | 1.5 ~ 1.9 | 2.7 ~ 2.9 | ○ |
| 45 | " | PF | Ag(Ti) | 5 | — | — | 0.8 ~ 1.0 | 0.5 ~ 0.7 | ○ |
| 46 | $Si_3N_4$ | " | " | 20 | — | — | 0.9 ~ 1.3 | 1.8 ~ 2.1 | ○ |
| 47 | " | " | " | 50 | — | — | 0.9 ~ 1.4 | 2.6 ~ 2.9 | ○ |
| 48 | " | CF | W | 5 | Ni—P plating | 5 | 1.9 ~ 2.3 | 0.9 ~ 1.4 | ○ |
| 49 | " | " | " | 20 | " | 5 | 2.0 ~ 2.4 | 2.0 ~ 2.3 | ○ |
| 50 | " | " | " | 50 | " | 5 | 2.1 ~ 2.5 | 2.5 ~ 2.9 | ○ |
| 51 | " | PF | Ag(Ti) | 5 | — | — | 1.1 ~ 1.4 | 1.5 ~ 1.6 | ○ |
| 52 | $Al_2O_3$ | " | " | 20 | — | — | 1.1 ~ 1.4 | 2.2 ~ 2.4 | ○ |
| 53 | " | " | " | 50 | — | — | 1.3 ~ 1.6 | 2.5 ~ 2.9 | ○ |
| 54 | " | CF | W | 5 | Ni—P plating | 5 | 1.9 ~ 2.1 | 0.9 ~ 1.3 | ○ |
| 55 | " | " | " | 20 | " | 5 | 2.0 ~ 2.3 | 2.2 ~ 2.3 | ○ |
| 56 | " | " | " | 50 | " | 5 | 2.1 ~ 2.4 | 2.6 ~ 2.9 | ○ |

Example 4

Samples specified in Table 4 were provided. In the samples, use was made of a specimen comprising an AlN-based substrate in such a stage that, in sample No. 34 of Example 3, the interposing layer has been formed. All the samples had the same construction, except that, in a combination of the substrate and the interposing layer of the same type for each sample, the outside dimensions (indicated, in the table, in terms of the difference in size ΔL between the periphery of the main plane of the conductor layer and the periphery of the main plane of the interposing layer) of the main plane of the conductor layer and the angle $θ_1$, that is, the angle of the side face of the conductor layer to the upper face of the interposing layer, and the angle $θ_2$, that is, the angle of the upper face to the side face of the conductor layer, as shown in FIGS. 9 and 10, were regulated. The material and thickness of the conductor layer were the same as described in Example 1, and the shape of the protruded portion was identical. The angles $θ_1$ and $θ_2$ were provided in the stage of punching of the material for the conductor layer, or in the stage of fine regulation by etching immediately after that. This was combined with the specimen which was in such a stage that the interposing layer has been formed, followed by joining under conditions for each sample adopted in Example 3. Thus, various samples described in Table 4 were prepared. Separately, thin, high-thermal conductivity silicon nitride ceramics A and B used in Example 3 were provided as the substrate (not described in Table 4), and the same interposing layer as used in sample 61 in Table 4 and an conductor layer having the same shape as used in sample 61 in Table 4 were joined in the same manner as described above to prepare circuit boards.

These samples were evaluated for the same items as described in Example 1. Before and after a heat cycle test as described in Example 1, the ultrasonic inspection and observation of magnified section were carried out. As a result, all the samples were free from any defect which poses a problem in practical use. Next, for each sample, the peel strength, the warpage of the board, and the puncture strength were evaluated in the same manner as in Example 1. For all the samples, the peel strength level (not given in Table 4) was substantially the same as that of the corresponding sample No. 34 of Example 3. The results of the warpage of the board and the puncture strength are also given in Table 4. The samples using the high-thermal conductivity silicon nitride ceramics A and B as the substrate and having the same joined structure as sample 61 (not described in Table 4) provided substantially the same levels of results as sample 61. From the above results, it is apparent that the warpage of the board can be reduced by rendering the size of the main plane of the conductor at least 0.05 mm smaller than that of the main plane of the interposing layer in both the lengthwise and widthwise directions thereof and, at the same time, slanting the end portion of the conductor layer at an angle $θ_1$ of not more than 80° or at an angle $θ_2$ of not less than 80°. In the heat cycle test, it was confirmed that the resistance to thermal stress load could also be improved. The effects could be confirmed also when the substrate was replaced with one comprising an $Si_3N_4$-based sintered body used in sample 13 in Example 1 and one comprising an $Al_2O_3$-based sintered body used in sample 14 in Example 1.

TABLE 4

| No. | Sample No. of Table 3 | Material for substrate | Conductor layer | | | | Warpage of board (μm/mm) | Puncture strength |
|---|---|---|---|---|---|---|---|---|
| | | | Size difference | | Slating angle (°) | | | |
| | | | ΔL | ΔX | θ₁ | θ₂ | | |
| *57 | 34 | AlN | 0 | 10 | 10 | 90 | 1.6 ~ 1.8 | Δ |
| 58 | " | " | +0.05 | " | 90 | 90 | 1.7 ~ 1.8 | ○ |
| 59 | " | " | +0.5 | " | 20 | 60 | 1.6 ~ 1.8 | ○ |
| 60 | " | " | +0.5 | " | 100 | 80 | 1.6 ~ 1.9 | ○ |
| 61 | " | " | +0.5 | " | 90 | 90 | 1.6 ~ 1.8 | ○ |
| 62 | " | " | +0.5 | " | 80 | 100 | 1.5 ~ 1.8 | ○ |
| 63 | " | " | +0.5 | " | 70 | 110 | 1.4 ~ 1.6 | ○ |
| 64 | " | " | +0.5 | " | 60 | 120 | 1.3 ~ 1.5 | ○ |

Note)
In the column of the slanting angle in the table, sample No. 62 has a conductor layer where the sectional form is such that the side portion is protruded outward as shown in FIG. 9, and sample No. 63 has a conductor layer where the sectional form is such that the slide portion is recessed inward as shown in FIG. 10. In the table, the numerical values of the slating angles are values described in FIGS. 9 and 10.
In the column of No. in the table, mark * represents Comparative Example.

Example 5

Figure 13:
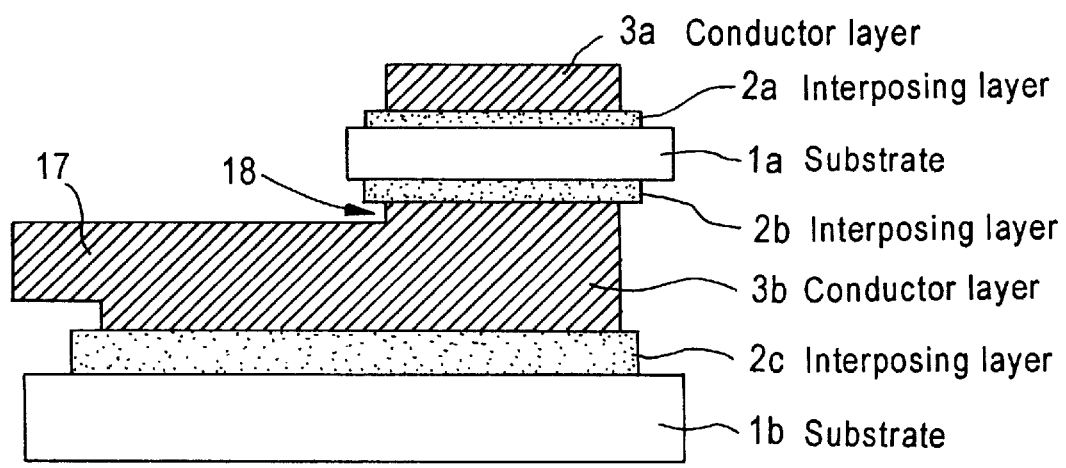
FIG. 13. is a schematic diagram showing an embodiment of the basic joined structure of the board according to the present invention.

20 specimens for each board sample were prepared based on the size specified in Tables 5 to 7. Each board comprised two joining units and each basic joining unit was composed of a combination of the substrate, the interposing layer, and the conductor layer as described in Example 1. For all the substrates, the thickness was 0.7 mm, and the length and the width in the main plane were identical to each other with the length and the width being 25 mm for the upper (second) unit and 50 mm for the lower (first) unit. The sectional structure is schematically shown in FIG. 13. The size of the conductor layer 3b in the joined interface of the conductor layer 3b and the interposing layer 2b or the interposing layer 2c was shorter than that of the interposing layer 2b or the interposing layer 2c. The conductor layer 3b has a protruded portion 17 in one direction. Three kinds of materials as used in Example 1, that is, AlN-based, $Si_3N_4$-based, and $Al_2O_3$-based materials, were used for the substrate. For each of green compacts of these materials, two sizes were prepared respectively for the first and second layers. Using these compacts as the starting material, substrates of three types of joining structures as specified in Tables 5 to 7 were prepared. For all the samples shown in Table 5, the two interposing layers each were prepared in a thickness of 20 μm using an Ag-based brazing material containing the same active metal Ti as used in sample 1 of Example 1. On the other hand, for all the samples specified in Tables 6 and 7, the three interposing layers each were prepared in the same manner as in Example 2, that is, by disposing, from the substrate side in the following order, a 20 μm-thick high-melting metallizing layer comprising W as a main component as used in Example 2 and a 5 μm-thick Ni—P-based low-melting metallizing layer as used in Example 2. For the samples specified in Table 6, the above compacts were sintered in the same manner as in Example 2, and the same W paste as used in Example 2 was printed and sintered. For the samples specified in Table 7, the W paste was applied by printing onto the compact and then fired in the same manner as in Example 2. For all the interposing layers, the variation in thickness was within 2 μm. As with Example 1, the dimensions in the planer direction of the interposing layer formed on the main plane of the substrate was somewhat smaller than the outside dimensions of the main plane of the substrate in both the length and width.

For the conductor layer, the material and the thickness were the same as those in Example 1. The shape was provided by punch pressing, and fine regulation of the dimensions was then carried out by etching. The length and width of the conductor layer in the planar direction in the joined interface of the conductor layer and the interposing layer were identical to each other. The difference in size between the conductor layer and the interposing layer were as described as $\Delta L_1$ to $\Delta L_3$ in the column of the "size difference." The board comprises a conductor layer 3a, an interposing layer 2a, a substrate 1a, an interposing layer 2b, a conductor layer 3b, an interposing layer 2c, and a substrate 1b laminated in that order from the outermost layer. $\Delta L_1$ is a value of (size of main plane of interposing layer 2a—size of main plane of conductor layer 3a), $\Delta L_2$ is a value of (size of main plane of interposing layer 2b—size of upper main plane of conductor layer 3b)—(supported by FIGS. 11 and 15 and the relevant explanation in the paragraph bridging pages 33 and 34 and Examples 6 and 7. As shown in FIGS. 11 and 15, the smaller substrate for the second (upper) unit is disposed above the larger substrate for the first unit), and $\Delta L_3$ is a value of (size of main plane of interposing layer 2c—size of lower main plane of conductor layer 3b)—(supported by FIGS. 11 and 15 and the relevant explanation in the paragraph bridging pages 33 and 34 and Examples 6 and 7. As shown in FIGS. 11 and 15, the smaller substrate for the second (upper) unit is disposed above the larger substrate for the first unit). In the same column, values of $\Delta X_1$ to $\Delta X_3$ each are the maximum length of the protruded portion of the conductor layer as used in Example 1. As with Example 1, for all the samples, the width of the protruded portion was substantially identical to the width of the joined portion.

Separately, the high-thermal conductivity silicon nitride ceramics as used in Example 1 were provided as the substrate, and circuit boards having the same joined structure of interposing layer and conductor layer as in sample 89 were prepared in the same manner as described above. The thickness of each substrate was smaller than that of the substrates specified in Table 6 and was 0.4 mm. The thickness of the board after lamination to provide a three-layer structure was about 30% smaller than that of the boards described in Table 6.

The board members thus prepared were assembled in the same manner as in Example 1 to prepare joined bodies. The products were evaluated for the same items as described in Example 1. The results are given in Tables 5 to 7. For the products wherein the size difference ΔL is less than +0.05 mm, the ultrasonic inspection and the observation of the section after the heat cycling showed that the defects such as cracks were created in the substrate portion. For all the samples falling within the scope of the present invention other than the above sample, the above defect was not found. The circuit boards using high-thermal conductivity silicon nitride ceramics as the substrate and having the same joined structure as sample 89 provided substantially the same results as sample 89.

TABLE 5

| | Material for substrate | | Size difference (mm) | | | | | | Peel strength of member | Warpage of board | Puncture |
|---|---|---|---|---|---|---|---|---|---|---|---|
| No. | 2nd layer | 1st layer | ΔL1 | ΔX1 | ΔL2 | ΔX2 | ΔL3 | ΔX3 | (kg/1 mm) | (μm/mm) | strength |
| *65 | AlN | AlN | +0.5 | −0.05 | 0 | 20 | +1.0 | 10 | 0.7 ~ 0.9 | 1.6 ~ 1.9 | ○ |
| 66 | " | " | +1.0 | " | +0.5 | " | " | " | 0.9 ~ 1.3 | 1.7 ~ 1.9 | ○ |
| 67 | " | " | " | " | +2.0 | " | " | " | 1.2 ~ 1.4 | 1.8 ~ 1.9 | ○ |
| 68 | " | " | " | " | " | " | " | " | 0.9 ~ 1.2 | 1.6 ~ 1.9 | ○ |
| 69 | Al$_2$O$_3$ | " | " | " | " | " | " | " | 1.0 ~ 1.2 | 1.6 ~ 1.8 | ○ |
| 70 | AlN | " | " | 10 | " | 30 | " | " | 1.1 ~ 1.3 | 1.7 ~ 1.9 | ○ |
| *71 | Si$_3$N$_4$ | Si$_3$N$_4$ | " | −0.05 | 0 | 20 | +1.0 | 10 | 0.9 ~ 1.2 | 1.5 ~ 1.9 | ○ |
| 72 | " | " | " | " | +0.5 | " | " | " | 0.8 ~ 1.1 | 1.6 ~ 1.8 | ○ |
| 73 | AlN | " | " | " | " | " | " | " | 0.7 ~ 1.0 | 1.7 ~ 1.9 | ○ |
| 74 | Al$_2$O$_3$ | " | " | " | " | " | " | " | 1.2 ~ 1.4 | 1.4 ~ 1.9 | ○ |
| 75 | " | " | " | " | " | " | " | " | 1.0 ~ 1.3 | 1.6 ~ 2.0 | ○ |
| 76 | Si$_3$N$_4$ | Si$_3$N$_4$ | " | 10 | +2.0 | 30 | " | " | 0.7 ~ 1.3 | 1.5 ~ 1.9 | ○ |
| 77 | Al$_2$O$_3$ | Al$_2$O$_3$ | " | −0.05 | +0.5 | 20 | +1.0 | 10 | 0.7 ~ 1.2 | 1.6 ~ 1.8 | ○ |
| 78 | " | " | " | " | " | " | " | " | 0.7 ~ 0.9 | 1.4 ~ 1.9 | ○ |
| 79 | " | " | " | " | +2.0 | " | " | " | 0.7 ~ 0.9 | 1.5 ~ 1.8 | ○ |
| 80 | AlN | " | " | " | " | " | " | " | 0.6 ~ 0.8 | 1.5 ~ 1.9 | ○ |
| 81 | Si$_3$N$_4$ | " | " | " | " | " | " | " | 0.8 ~ 1.0 | 1.6 ~ 1.9 | ○ |
| 82 | Al$_2$O$_3$ | " | " | 10 | " | " | " | " | 1.1 ~ 1.3 | 1.6 ~ 1.9 | ○ |

In the table, mark * represents Comparative Example.

TABLE 6

| | Material for substrate | | Size difference (mm) | | | | | | Peel strength of member | Warpage of board | Puncture |
|---|---|---|---|---|---|---|---|---|---|---|---|
| No. | 2nd layer | 1st layer | ΔL1 | ΔX1 | ΔL2 | ΔX2 | ΔL3 | ΔX3 | (kg/1 mm) | (μm/mm) | strength |
| *83 | AlN | AlN | +0.5 | −0.05 | 0 | 20 | +1.0 | 10 | 1.0 ~ 1.2 | 1.9 ~ 2.2 | ○ |
| 84 | " | " | +1.0 | " | +0.5 | " | " | " | 1.0 ~ 1.5 | 1.6 ~ 1.9 | ○ |
| 85 | " | " | +1.0 | " | +2.0 | " | " | " | 1.3 ~ 1.6 | 1.8 ~ 1.9 | ○ |
| 86 | " | " | " | 10 | " | 30 | " | " | 1.3 ~ 1.5 | 1.9 ~ 2.2 | ○ |
| *87 | Si$_3$N$_4$ | Si$_3$N$_4$ | " | −0.05 | 0 | 20 | " | " | 0.9 ~ 1.1 | 1.9 ~ 2.3 | ○ |
| 88 | " | " | " | " | +0.5 | " | " | " | 1.0 ~ 1.2 | 1.4 ~ 1.9 | ○ |
| 89 | " | " | " | " | +2.0 | " | " | " | 1.0 ~ 1.2 | 1.6 ~ 1.8 | ○ |
| 90 | " | " | " | 10 | " | 30 | " | " | 0.9 ~ 1.2 | 1.5 ~ 1.9 | ○ |
| *91 | Al$_2$O$_3$ | Al$_2$O$_3$ | " | −0.05 | 0 | 20 | " | " | 1.2 ~ 1.5 | 1.7 ~ 1.9 | ○ |
| 92 | " | " | " | " | +0.5 | " | " | " | 1.3 ~ 1.7 | 1.6 ~ 1.7 | ○ |
| 93 | " | " | " | " | +2.0 | " | " | " | 1.3 ~ 1.8 | 1.7 ~ 1.9 | ○ |
| 94 | " | " | " | 10 | " | " | " | " | 1.2 ~ 1.6 | 1.4 ~ 1.9 | ○ |

In the table, mark * represents Comparative Example.

TABLE 7

| | Material for substrate | | Size difference (mm) | | | | | | Peel strength of member | Warpage of board | Puncture |
|---|---|---|---|---|---|---|---|---|---|---|---|
| No. | 2nd layer | 1st layer | ΔL1 | ΔX1 | ΔL2 | ΔX2 | ΔL3 | ΔX3 | (kg/1 mm) | (μm/mm) | strength |
| *95 | AlN | AlN | +0.5 | −0.05 | 0 | 20 | +1.0 | 10 | 2.0 ~ 2.2 | 1.6 ~ 1.9 | ○ |
| 96 | " | " | +1.0 | " | +0.5 | " | " | " | 2.0 ~ 2.5 | 1.7 ~ 1.9 | ○ |
| 97 | " | " | " | " | +2.0 | " | " | " | 1.9 ~ 2.2 | 1.5 ~ 1.8 | ○ |
| 98 | " | " | " | 10 | " | 30 | " | " | 2.0 ~ 2.5 | 1.6 ~ 2.0 | ○ |
| *99 | Si$_3$N$_4$ | Si$_3$N$_4$ | " | −0.05 | 0 | 20 | " | " | 2.0 ~ 2.2 | 1.4 ~ 1.7 | ○ |
| 100 | " | " | " | " | +0.5 | " | " | " | 1.8 ~ 2.1 | 1.6 ~ 1.8 | ○ |
| 101 | " | " | " | " | +2.0 | " | " | " | 2.0 ~ 2.2 | 1.5 ~ 1.9 | ○ |
| 102 | " | " | " | 10 | " | 30 | " | " | 2.0 ~ 2.4 | 1.6 ~ 1.9 | ○ |
| *103 | Al$_2$O$_3$ | Al$_2$O$_3$ | " | −0.05 | 0 | 20 | " | " | 1.7 ~ 2.0 | 1.4 ~ 1.7 | ○ |

TABLE 7-continued

| | Material for substrate | | Size difference (mm) | | | | | | Peel strength of member | Warpage of board | Puncture |
| --- | --- | --- | --- | --- | --- | --- | --- | --- | --- | --- | --- |
| No. | 2nd layer | 1st layer | ΔL1 | ΔX1 | ΔL2 | ΔX2 | ΔL3 | ΔX3 | (kg/1 mm) | (μm/mm) | strength |
| 104 | " | " | " | " | +0.5 | " | " | " | 1.8 ~ 2.1 | 1.6 ~ 1.8 | ○ |
| 105 | " | " | " | " | +2.0 | " | " | " | 1.9 ~ 2.2 | 1.5 ~ 1.9 | ○ |
| 106 | " | " | " | 10 | " | " | " | " | 1.8 ~ 2.1 | 1.6 ~ 1.8 | ○ |

In the table, mark * represents Comparative Example.

Example 6

Substrates were prepared in the same manner as in Example 5. The substrates had an outside size, in both the lengthwise and widthwise directions, of 50 mm for the first layer and 25 mm for the second layer. The material for the first layer and the material for the second layer were identical to each other. An AlN-based material, an $Si_3N_4$-based material, and an $Al_2O_3$-based material were used as the material for the substrate. For each layer, the material for the conductor layer was formed in the same manner as in Example 5, and the material for the interposing layer was prepared in the same manner as in Example 5. Among combinations of these materials, substrates comprising a combination of shape and material specified in samples 68, 72, 76, 80, 92, 96, and 100 in Example 5 and an interposing layer having a construction specified in Table 8 were assembled to prepare boards, followed by joining to prepare board samples. In this case, as with Example 1, the main plane of the interposing layer was made somewhat smaller than the main plane of the substrate. The composition, the thickness and the like of the interposing layer were as specified in Table 8. The interposing layer was formed as follows. When the first layer was constituted by a brazing material layer only, the interposing layer was prepared in the same manner as in Example 1. When the interposing layer comprises a first layer of a high-melting metallizing layer and a second layer of a low-melting metallizing layer comprising Ni as a main component, the interposing layer was prepared in the same manner as in Example 2. For all the samples, the material and the thickness of the conductor layer were identical to those of the conductor layer in Example 1. For all the samples, the difference ΔL in size between the conductor layer and the interposing layer in the joined interface of the conductor layer and the interposing layer was +1.0 mm. For all the samples, as with Example 1, the maximum length of the conductor layer extended from the interposing layer was 10 mm. The boards samples thus prepared were evaluated for the same items as described in Example 1. Before and after the heat cycle test, the ultrasonic inspection and observation of the section of the board were carried out. As a result, any unfavorable defect, such as cracking of the substrate, was not found in the joined interface of the substrate and the interposing layer.

TABLE 8

| | Substrate | | | Interposing layer (thickness in μm) | | | | Peel strength of conductor layer | Warpage of board | Puncture |
| --- | --- | --- | --- | --- | --- | --- | --- | --- | --- | --- |
| | Material | | Preparation | 1st layer | | 2nd layer | | | | |
| No. | No. | Material | process | Material | Thickness | Material | Thickness | (kg/1 mm) | (μm/mm) | strength |
| 107 | 68 | AlN | PF | Ag(Ti) | 5 | — | — | 0.8 ~ 0.9 | 1.0 ~ 1.5 | ○ |
| 108 | " | " | " | " | 20 | — | — | 0.9 ~ 1.2 | 1.6 ~ 1.9 | ○ |
| 109 | " | " | " | " | 50 | — | — | 0.9 ~ 1.3 | 2.0 ~ 2.4 | ○ |
| 110 | 72 | $Si_3N_4$ | " | " | 5 | — | — | 0.9 ~ 1.4 | 1.3 ~ 1.6 | ○ |
| 111 | " | " | " | " | 20 | — | — | 1.0 ~ 1.3 | 1.6 ~ 1.9 | ○ |
| 112 | " | " | " | " | 50 | — | — | 1.1 ~ 1.3 | 2.0 ~ 2.5 | ○ |
| 113 | 76 | $Al_2O_3$ | " | " | 5 | — | — | 1.1 ~ 1.3 | 1.2 ~ 1.6 | ○ |
| 114 | " | " | " | " | 20 | — | — | 0.8 ~ 1.0 | 1.6 ~ 1.9 | ○ |
| 115 | " | " | " | " | 50 | — | — | 1.1 ~ 1.3 | 2.2 ~ 2.6 | ○ |
| 116 | 80 | AlN | " | W | 5 | Ni—P | 5 | 1.2 ~ 1.4 | 1.3 ~ 1.6 | ○ |
| 117 | " | " | " | " | 20 | " | " | 1.3 ~ 1.4 | 1.7 ~ 2.0 | ○ |
| 118 | " | " | " | " | 50 | " | " | 1.4 ~ 1.6 | 2.2 ~ 2.6 | ○ |
| 119 | 92 | " | CF | " | 5 | " | " | 1.6 ~ 1.8 | 1.2 ~ 1.5 | ○ |
| 120 | " | " | " | " | 20 | " | " | 1.5 ~ 1.9 | 1.5 ~ 1.8 | ○ |
| 121 | " | " | " | " | 50 | " | " | 1.6 ~ 1.8 | 2.3 ~ 2.6 | ○ |
| 122 | 96 | $Si_3N_4$ | " | " | 5 | " | " | 1.2 ~ 1.6 | 1.4 ~ 1.8 | ○ |
| 123 | " | " | " | " | 20 | " | " | 1.9 ~ 2.1 | 1.6 ~ 2.0 | ○ |
| 124 | " | " | " | " | 50 | " | " | 1.9 ~ 2.3 | 2.4 ~ 2.7 | ○ |
| 125 | 100 | $Al_2O_3$ | " | " | 5 | " | " | 2.0 ~ 2.4 | 1.4 ~ 1.9 | ○ |
| 126 | " | " | " | " | 20 | " | " | 2.1 ~ 2.5 | 1.6 ~ 2.0 | ○ |
| 127 | " | " | " | " | 50 | " | " | 1.8 ~ 2.1 | 2.3 ~ 2.6 | ○ |

Example 7

Samples as specified in Table 9 were prepared. Specifically, intermediate assemblies in the form of the lower (first) lamination layer and the upper (second) lamination layer in sample No. 98 in such a stage that the interposing layer has been formed, were used as starting materials. In this example, various slanting angles $\theta_1$ were newly provided on the side portion of the two conductor layers used in the sample. For the two conductor layers, an identical slanting angle was provided. For the second conductor layer, however, the angle $\theta_2$ (supported by the definition on page 74, lines 3–7 and values shown in Tables 5–7). of the upper surface to the side portion in the conductor layer was $(180-\theta)°$. The angles $\theta_1$ and $\theta_2$ are those as shown in FIGS. 9 and 10.—(supported by the definition on page 74, lines 3–7 and values shown in Tables 5–7). For the conductor layer, the shape having predetermined dimensions was previously provided by punch pressing, and the angle of the side face was then provided by etching. The difference in size, in the main plane of the joined portion, between the conductor layer and the adjacent interposing layer and the shape of the protruded portion of the conductor layer were the same as those of Sample No. 98. Thereafter, joining was carried out in the same manner as in Example 1 to prepare laminate boards. The board samples thus prepared were evaluated for the same items as described in Example 1. The results are given in Table 9. After the heat cycling, ultrasonic inspection and observation of the section were carried out. As a result, for the samples, wherein the slanting angle —$\theta_1$—(supported by the definition on page 74, lines 3–7 and values shown in Tables 5–7). exceeded 80°, very small pinholes were present in places around the joined interface. These pinholes, however, were not those that pose a problem in practical use. For all the samples falling within the scope of the present invention other than the above samples, such defects were not found.

Example 9

Figure 14A:
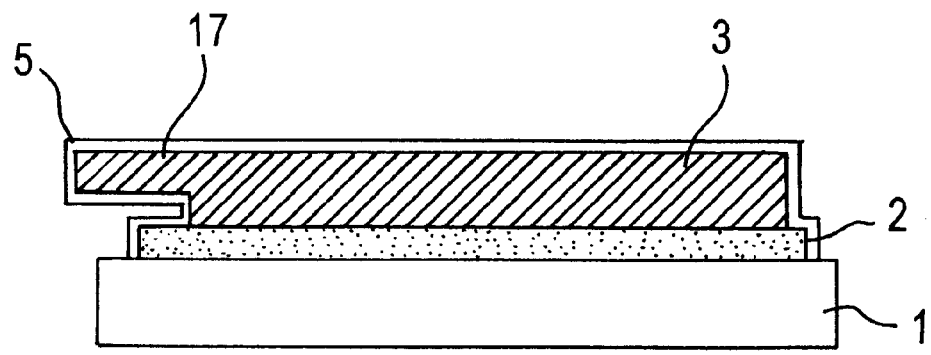
FIG. 14(*a*) and FIG. 14(*b*) are a schematic diagram showing an embodiment of the basic joined structure of the board according to the present invention.
Figure 14B:
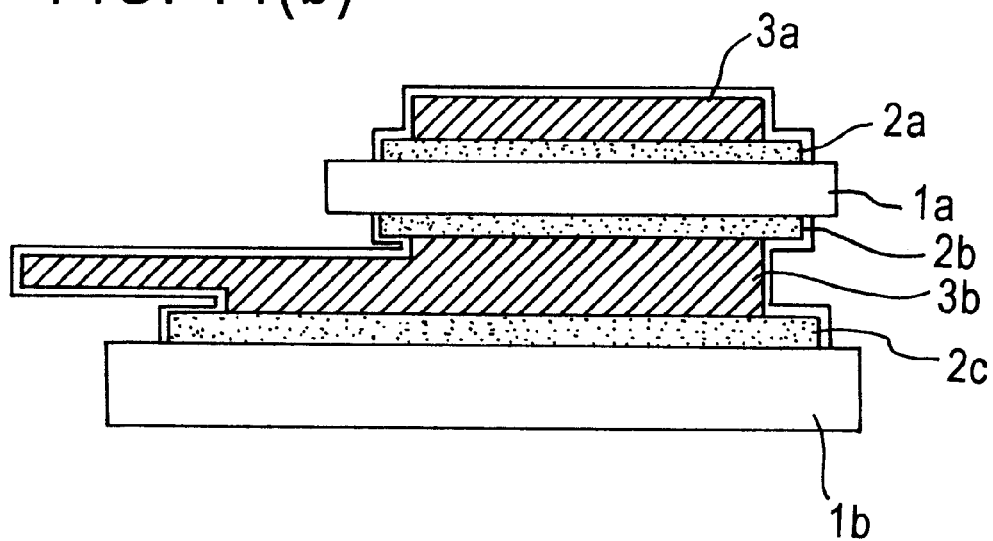

Among the samples prepared in the above Examples, board samples of sample Nos. 6, 13, 16, 20, 21, 22, 28, 31, 39, 42, 46, 52, 108, 111, 114, 117, 120, 123, and 126 were selected. An outer layer comprising Ni as a main component was formed on the outer surface of these board samples. As schematically shown in FIG. 14, for both the board of a single unit structure (a) and a two-unit laminate structure (b), the outer layer was formed on the upper surface and side portion of the conductor layer 3 and the interposing layer 2 in its whole areas not covered with the conductor layer. The outer layer 5 was formed in various thicknesses as specified in the column of "outer layer" in Table 10. In this example, for all the samples, the difference in size ($\Delta L$) between the main plane of the conductor layer and the main plane of the interposing layer was 1.0 mm. In the board having a two-layer structure, the $\Delta L$ value in all the three places was 1.0 mm. Further, in this example, for all the samples, the slanting angle $\theta$ of the conductor layer (angle of the joined interface of the conductor layer and the interposing layer to the side portion of the conductor layer) was 80° for both the upper and lower faces (that is, both of $\theta_1$ and $\theta_2$) of the lower conductor layer and, in the upper conductor layer, was 80° in the interface of the conductor layer and the lower interposing layer and 100° in terms of the angle of the upper face to the side portion in the conductor layer. Further, in this example, for all the samples, the maximum dimension of the protruded portion of the conductor layer was 10 mm. These samples were evaluated for the same items as described in

TABLE 9

| No. | Sample No. of Table 7 | Material for substrate | Slanting angle of conductor layer (°) $\theta_1$ | $\theta_2$ | Warpage of board (μm/mm) | Puncture strength |
|---|---|---|---|---|---|---|
| 128 | 98 | AlN | 90 | 90 | 1.6 ~ 1.8 | ○ |
| 129 | " | " | " | " | 1.7 ~ 1.8 | ○ |
| 130 | " | " | 120 | 60 | 1.6 ~ 1.8 | ○ |
| 131 | " | " | 100 | 80 | 1.6 ~ 1.9 | ○ |
| 132 | " | " | 90 | 90 | 1.6 ~ 1.8 | ○ |
| 133 | " | " | 80 | 100 | 1.5 ~ 1.8 | ○ |
| 134 | " | " | 70 | 110 | 1.4 ~ 1.6 | ○ |
| 135 | " | " | 60 | 120 | 1.3 ~ 1.5 | ○ |
| 136 | " | " | 80 | 80 | 1.6 ~ 1.8 | ○ |

Example 8

Intermediate assemblies in the form of the first lamination layer and the second lamination layer in sample No. 98 in such a stage that the interposing layer has been formed, were used as starting materials. In this example, a paste comprising copper as a main component was applied by printing in a thickness of 0.3 mm the main planes of both the two kinds of materials, followed by drying in the air at 150° C. Thereafter, the two kinds of materials were assembled so that the copper printed faces come into contact with each other. The assembly was then heated in a nitrogen stream at 800° C. to form a copper circuit. Thus, a circuit board comprising a laminate of two joined materials was prepared. The board sample thus prepared was evaluated for the same items as described in Example 1. As a result, the evaluation results were substantially the same as those of sample No. 98 of Example 5. Before and after the heat cycle test, the ultrasonic inspection and observation of the section were carried out. As a result, any unfavorable defect, such as cracking, was not found in the substrate portion.

Example 1. The results are given in Table 10. From the results, it is apparent that the provision of the outer layer resulted in further improved peel strength. Before and after the heat cycle test, the ultrasonic inspection and observation of the section of the board were carried out. As a result, any unfavorable defect, such as cracking, was not found in the substrate in the joined interface of the substrate and the interposing layer.

Next, sample Nos. 139, 145, 146, 158, 159, 160, 165, 166, and 167 specified in Table 10 were selected as a sample group 1 having an outer layer. On the other hand, boards of samples 6, 13, 16, 42, 46, 52, 120, 123, and 126 were selected as a sample group 2 consisting of base members which had the joined structures corresponding to the samples of the group 1. For these samples, a moisture-proof test was repeated five times wherein each sample was allowed to stand under conditions of a temperature of 60° C. and a humidity of 90% for 2 hr. After each test cycle, each sample was inspected for the formation of a cuprous oxide layer on the surface of the conductor layer. Further, after each test cycle, the outer periphery of each sample was visually inspected mainly for the discoloration and a change in properties of the main plane of the conductor layer, particularly for the formation of a cuprous oxide layer on the surface thereof. In this case, before and after the test, the main plane of the conductor layer in each sample was analyzed by X-ray diffractometry to investigate a change in phase of the surface. As a result, it was found that the formation of an outer layer comprising Ni as a main component resulted in markedly improved moisture resistance. Specifically, for all the samples belonging to the sample group 1 having an outer layer, after the 5th test cycle, discoloration and a change in properties, of the main plane of the conductor layer, including a change in phase of the surface thereof was not found.

On the other hand, for the sample group 2 not having an outer layer, after the first test cycle, a change in properties was found, that is, the formation of a thin cuprous oxide layer on the surface of the conductor layer was found. From the above result, it is apparent that the formation of an outer layer can realize a circuit board excellent also in moisture resistance.

in a ball mill for 24 hr. Thus, three kinds of mixed powders, that is, an AlN mixed powder containing $Y_2O_3$—CaO as a sintering aid, an $Si_3N_4$ mixed powder containing $Y_2O_3$—CaO as a sintering aid, and an $Al_2O_3$ mixed powder containing $Y_2O_3$—CaO as a sintering aid were obtained. 10 parts by weight of PVB as a binder was added to 100 parts by weight of each mixed powder to prepare slurries. A part of each of the slurries was spray dried, followed by molding using a powder molding press to prepare compacts. Half of these compacts were selected. The compact comprising AlN as a main component and the compact comprising $Si_3N_4$ as a main component were sintered in a nitrogen atmosphere at 1,700° C. for 5 hr. On the other hand, the compact comprising $Al_2O_3$ as a main component was sintered in the air at 1,600° C. for 5 hr. For all the sintered bodies thus prepared, the relative density (the percentage of the density measured by the submerging method to the theoretical density presumed to be 100%) was 99%, and the surface was free from defects, such as voids, that pose a problem in practical use. Further, for these sintered bodies, the thermal conductivity was measured by a laser flash method. As a result, the thermal conductivity was 150 to 160 W/m·K for

TABLE 10

| No. | Substrate Material No. | Substrate Material | Outer layer Material | Outer layer Thickness ($\mu$m) | Peel strength of conductor layer (kg/1 mm) | Warpage of board ($\mu$m/mm) | Puncture strength |
|---|---|---|---|---|---|---|---|
| 137 | 6 | AlN | Ni—P plating | 1 | 1.0 ~ 1.3 | 1.4 ~ 1.8 | ○ |
| 138 | " | " | " | 2 | 1.0 ~ 1.4 | 1.3 ~ 1.7 | ○ |
| 139 | " | " | " | 10 | 1.1 ~ 1.4 | 1.4 ~ 1.8 | ○ |
| 140 | " | " | " | 20 | 1.1 ~ 1.5 | 1.3 ~ 1.6 | ○ |
| 141 | " | " | " | 40 | 1.2 ~ 1.4 | 1.2 ~ 1.4 | ○ |
| 142 | " | " | " | 50 | 1.2 ~ 1.6 | 1.3 ~ 1.6 | ○ |
| 143 | " | " | Ni—P printing | 10 | 1.0 ~ 1.3 | 1.4 ~ 1.6 | ○ |
| 144 | " | " | Ni—P thermal spraying | 10 | 1.0 ~ 1.4 | 1.4 ~ 1.8 | ○ |
| 145 | 13 | $Si_3N_4$ | Ni—P plating | 10 | 0.9 ~ 1.3 | 1.6 ~ 2.0 | ○ |
| 146 | 16 | $Al_2O_3$ | " | 10 | 0.8 ~ 1.1 | 1.5 ~ 1.8 | ○ |
| 147 | 20 | AlN | " | 10 | 0.9 ~ 1.2 | 1.6 ~ 1.9 | ○ |
| 148 | 21 | " | " | 10 | 0.9 ~ 1.4 | 1.4 ~ 1.6 | ○ |
| *149 | 22 | " | " | 10 | 0.4 ~ 0.5 | 1.6 ~ 1.9 | Δ |
| 150 | 28 | " | " | 1 | 1.5 ~ 1.7 | 1.4 ~ 1.7 | ○ |
| 151 | " | " | " | 2 | 1.4 ~ 1.8 | 1.4 ~ 1.6 | ○ |
| 152 | " | " | " | 10 | 1.5 ~ 1.7 | 1.6 ~ 1.7 | ○ |
| 153 | " | " | " | 20 | 1.4 ~ 1.7 | 1.5 ~ 1.7 | ○ |
| 154 | " | " | " | 40 | 1.5 ~ 1.8 | 1.4 ~ 1.6 | ○ |
| 155 | " | " | " | 50 | 1.6 ~ 1.8 | 1.3 ~ 1.5 | ○ |
| 156 | 31 | " | " | 10 | 0.9 ~ 1.2 | 0.4 ~ 0.5 | ○ |
| 157 | 39 | " | " | 10 | 1.2 ~ 1.4 | 0.8 ~ 1.2 | ○ |
| 158 | 42 | " | " | 10 | 1.5 ~ 1.7 | 2.2 ~ 2.5 | ○ |
| 159 | 46 | $Si_3N_4$ | " | 10 | 1.0 ~ 1.3 | 1.2 ~ 1.4 | ○ |
| 160 | 52 | $Al_2O_3$ | " | 10 | 1.2 ~ 1.4 | 1.4 ~ 1.6 | ○ |
| 161 | 108 | AlN | " | 10 | 0.9 ~ 1.3 | 1.5 ~ 1.6 | ○ |
| 162 | 111 | $Si_3N_4$ | " | 10 | 1.3 ~ 1.5 | 1.4 ~ 1.6 | ○ |
| 163 | 114 | $Al_2O_3$ | " | 10 | 0.9 ~ 1.3 | 1.3 ~ 1.6 | ○ |
| 164 | 117 | AlN | " | 10 | 1.4 ~ 1.6 | 1.3 ~ 1.5 | ○ |
| 165 | 120 | " | " | 10 | 1.8 ~ 2.3 | 1.4 ~ 1.6 | ○ |
| 166 | 123 | $Si_3N_4$ | " | 10 | 1.9 ~ 2.3 | 1.5 ~ 1.7 | ○ |
| 167 | 126 | $Al_2O_3$ | " | 10 | 2.2 ~ 2.6 | 1.4 ~ 1.6 | ○ |

In the table, mark * in the column of No. represents Comparative Example.

Example 10

An AlN powder, an $Si_3N_4$ powder, and $Al_2O_3$ powder each having an average particle diameter of 1 $\mu$m were provided as main component powders. Further, a $Y_2O_3$ powder having an average particle diameter of 0.6 $\mu$m and a CaO powder having an average particle diameter of 0.3 $\mu$m were provided. 97% by weight of one of the three kinds of main component powders, 1.5% by weight of the $Y_2O_3$ powder, and 1.5% by weight of the CaO powder were weighed and intimately mixed together in an ethanol solvent the AlN sintered body, 50 to 60 W/m·K for the $Si_3N_4$ sintered body, and 30 to 40 W/m·K for the $Al_2O_3$ sintered body. One main plane of these sintered bodies was coated with a high-melting metal paste as follows. Specifically, a high-melting metal W having an average particle diameter 1 $\mu$m was added by portions to a mixture prepared by mixing 10% by weight of a solvent, 5% by weight of $SiO_2$—CaO—$B_2O_3$-based glass, and 5% by weight of an organic binder together in a ball mill, and the resultant paste was adjusted to a viscosity of 200 ps. The paste was then applied by printing using a 200-mesh screen, followed by firing in a nitrogen atmosphere for one hr at 1,600° C. to form a high-melting metallizing layer (post firing method).

On the other hand, one main plane of the remaining half of the compacts was printing-coated with the above high-melting metal paste, and firing was carried out in a nitrogen atmosphere for 5 hr at 1,700° C. to sinter each compact body and, at the same time, to sinter the high-melting metal paste (cofiring method). For all the metallized AlN boards with the W high-melting metallizing layer formed thereon in the above step, the size was 25 mm in width, 25 mm in length, and 0.7 mm in thickness, the type of which was indicated in the following Table 11. "CF" described in the column of preparation process is an abbreviation for cofiring, and "PF" an abbreviation for post firing. For these metallized boards, the surface roughness was measured with a contact type surface roughness meter wherein the tip of the roughness meter was a probe of R=5 μm and the cut-off was 0.8 mm.

Next, 10 specimens for each sample were selected. The surface metallized with a high-melting metal was plated with nickel-phosphorus, followed by holding in a nitrogen atmosphere at 600° C. for 30 min to fire the plating. The metallic interposing layer thus prepared was free from unfavorable phenomena, such as swelling and separation. Further, for all the samples, the plating thickness was within 6±2 μm.

An electrolytic copper material specified in JIS C1020 was put thereon as a conductor layer having a width and a length, which were 0.5 mm smaller than the W metallizing layer, and a thickness of 0.3 mm. These assemblies were set on a setter made of graphite and subjected to joining in an oven under non-load conditions in a nitrogen stream at 970° C. for 30 min. In any place of the joined bodies, the copper sheet was not extended from the W metallizing layer. At the time of joining, each sample was subjected to ultrasonic inspection. As a result, no unacceptable defect was found. Further, after the joining, the section of the samples was observed under SEM (a scanning electron microscope) at a magnification of 1,000 times. As a result, unacceptable defects, such as cracks and pinholes, were not found in the interface.

For each sample thus prepared, the peel strength and the degree of warpage were measured, and the results, together with the size of the substrate and the surface roughness of the metallized face, are also given in Table 11. The degree of the warpage was determined as follows. The sample was put on a surface plate with the conductor layer side facing upward, and, in this state, the height from the surface plate was measured on diagonals. The difference between the maximum height from the surface plate and the minimum height from the surface plate was determined, and this value was expressed in terms of one per mm of the diagonal as the degree of warpage. Regarding the peel strength of the joined portion, as shown in FIG. 6, a conductor layer 3 having a size of 0.1 mm in thickness×4.0 mm in width was joined in a length 1 of 3 mm through a metallic interposing layer 2 provided on the high-melting metallizing layer of the substrate 1. Thereafter, the grip portion 6 protruded upward perpendicularly from one end of the conductor layer 4 was pulled upward at a rate of 20 mm/min to measure the peel strength.

TABLE 11

| Sample | Material | Preparation process | Particle diameter of W (μm) | Count of screen (mesh) | Viscosity of paste (ps) | Metallizing layer Thickness (μm) | Surface roughness Ra (μm) | Peel strength of conductor layer (kg/l mm) | Warpage of member (μm/mm) |
|---|---|---|---|---|---|---|---|---|---|
| 168 | AlN | PF | 1 | 200 | 200 | 2 | 0.8 | 0.6 ~ 1.2 | 1.8 ~ 2.0 |
| 169 | | | 3 | 100 | 400 | 3 | 1.1 | 1.0 ~ 1.5 | 1.7 ~ 2.0 |
| 170 | | | 0.3 | 150 | 600 | 5 | 1.9 | 1.1 ~ 1.4 | 1.9 ~ 2.2 |
| 171 | | | 2 | 300 | 200 | 10 | 1.2 | 1.2 ~ 1.5 | 1.9 ~ 2.1 |
| 172 | | | 1 | 400 | 100 | 20 | 0.9 | 1.3 ~ 1.6 | 2.0 ~ 2.2 |
| 173 | | | 0.5 | 500 | 80 | 50 | 1.4 | 1.2 ~ 1.4 | 2.4 ~ 2.9 |
| 174 | | | 0.5 | 200 | 500 | 60 | 2.3 | 1.7 ~ 2.0 | 2.9 ~ 3.0 |
| 175 | | CF | 1 | 200 | 200 | 5 | 0.9 | 1.0 ~ 1.4 | 0.8 ~ 1.2 |
| 176 | | | 1.5 | 300 | 100 | 20 | 2.6 | 1.8 ~ 2.3 | 2.0 ~ 2.3 |
| 177 | | | 3.0 | 500 | 80 | 50 | 1.8 | 1.9 ~ 2.4 | 2.6 ~ 2.9 |
| 178 | $Si_3N_4$ | PF | 1 | 200 | 200 | 5 | 0.8 | 1.1 ~ 1.6 | 1.0 ~ 1.2 |
| 179 | | | 2 | 300 | 300 | 20 | 2.1 | 1.3 ~ 1.8 | 1.8 ~ 2.5 |
| 180 | | | 3 | 200 | 500 | 50 | 2.9 | 1.5 ~ 1.9 | 2.5 ~ 2.9 |
| 181 | | CF | 1 | 400 | 200 | 5 | 1.3 | 1.0 ~ 1.6 | 1.5 ~ 2.0 |
| 182 | | | 1.5 | 300 | 100 | 20 | 1.5 | 1.6 ~ 1.9 | 1.8 ~ 2.4 |
| 183 | | | 3 | 500 | 300 | 50 | 2.8 | 1.6 ~ 1.9 | 2.5 ~ 2.8 |
| 184 | $Al_2O_3$ | PF | 1 | 150 | 200 | 5 | 1.0 | 1.0 ~ 1.2 | 1.4 ~ 1.7 |
| 185 | | | 1.5 | 300 | 200 | 20 | 1.2 | 1.3 ~ 1.8 | 1.8 ~ 2.0 |
| 186 | | | 1 | 200 | 500 | 50 | 2.3 | 1.4 ~ 1.8 | 2.4 ~ 2.8 |
| 187 | | CF | 1 | 400 | 200 | 5 | 1.3 | 1.0 ~ 1.4 | 1.4 ~ 1.8 |
| 188 | | | 1.5 | 300 | 100 | 20 | 1.6 | 1.4 ~ 1.8 | 1.8 ~ 2.5 |
| 189 | | | 2.5 | 250 | 90 | 50 | 2.8 | 1.6 ~ 1.9 | 2.4 ~ 2.8 |

As is apparent from the above results, according to the structure of the present invention, for samples wherein when the thickness of the high-melting metallizing layer is less than 3 μm, the peel strength is in the vicinity of the lower limit 0.5 kg/1 mm of the target range, while for sample 7 wherein when the thickness of the high-melting metallizing layer exceeds 50 μm, the warpage is in the vicinity of the upper limits 3 μm/1 mm of the target range. In these cases, there is a possibility that the target requirement cannot be satisfied in practical use. For this reason, it is apparent that the thickness of the high-melting metallizing layer should be 3 to 50 μm from the viewpoint of fully and stably satisfying the standards with respect to the peel strength and the warpage.

Further, from the data given in Table 11, comparison of post firing with cofiring reveals the following points. The peel strength of the cofired product is about twice higher than that of the post fired product. The reason for this is that, in the cofiring wherein W alone is sintered on the sintered body, W and AlN are strongly joined to each other by the so-called "anchor effect" and, in addition, W per se is also densified.

Further, the post fired product is superior in surface evenness to the cofired product. The reason for this is considered as follows. In the cofired product, the solvent contained in the W paste is likely to be absorbed into the sheet. Therefore, in this case, migration of a thicker w paste portion to a thinner W paste portion after printing, that is, the so-called "leveling effect", is not significant. On the other hand, for the post fired product, since printing is carried out on the sintered substrate, the absorption of the solvent does not occur. Thus, this offers large leveling effect.

Comparative Example 1

A sample was prepared as follows. The amount of the solvent added was reduced by 20% by weight as compared with the amount of the solvent used in the W paste used in Example 10 to prepare a W paste containing 5% by weight of an $SiO_2$ frit. One side of a compact prepared in the same manner as in Example 10 was coated with this paste, and the coating was sintered by the cofiring in the same manner as in Example 10 to form a 20 μm-thick high-melting metallizing layer. Thereafter, nickel-phosphorus plating was carried out in the same manner as in Example 10, followed by joining of the copper sheet in the same manner as in Example 10. The joined body thus prepared was analyzed by ultrasonic inspection and SEM at a magnification of 1,000 times. As a result, unacceptable defects, such as cracks and pinholes, were not found. The peel strength and warpage of the sample thus prepared and the surface roughness of the high-melting metallizing layer were measured. The results are given in Table 12. For this sample, as compared with Example 11, the degree of warpage was slightly increased, and the surface evenness was slightly deteriorated. These, however, posed no problem in practical use.

TABLE 12

| Sample | Material | Preparation process | Particle diameter of W (μm) | Count of screen (mesh) | Viscosity of paste (ps) | Metallizing layer | | | |
| --- | --- | --- | --- | --- | --- | --- | --- | --- | --- |
| | | | | | | Thickness (μm) | Surface roughness Ra (μm) | Peel strength of conductor layer (kg/1 mm) | Warpage of member (μm/mm) |
| 190 | AlN | CF | 5 | 90 | 900 | 20 | 4.6 | 1.8 ~ 2.3 | 2.2 ~ 2.5 |
| 191 | $Si_3N_4$ | | 4 | 100 | 800 | 20 | 4.9 | 1.6 ~ 1.9 | 1.9 ~ 2.5 |
| 192 | $Al_2O_3$ | | 3.5 | 100 | 700 | 20 | 5.0 | 1.4 ~ 1.8 | 1.9 ~ 2.6 |

Example 11

In printing a high-melting metallizing layer on the compact prepared in Example 1, a high-melting metallizing layer portion for forming thereon a conductor layer comprising copper as a main component in a later step and a high-melting metallizing layer portion for a fine pattern serving as a signal conductor to a semiconductor element were provided on the same plane by printing in the same manner as described above in connection with sample No. 175 of Example 1. Sintering was then carried out in the same manner as in Example 1 to prepare a ceramic board comprising a substrate, with a width of 25 mm, a length of 25 mm, and a thickness of 0.7 mm, having thereon the high-melting metallizing layer having the portion for forming a conductor layer with a width of 15 mm and a length of 20 mm and the portion for forming a signal conductor layer with a width of 1 mm and a length of 3 mm. A 10 μm-thick nickel-phosphorus plating was provided on each 10 high-melting metallizing layers to prepare a metallic interposing layer.

Next, a 0.3 mm-thick copper sheet was put on the Ni—P metallic interposing layer, followed by heating in the same manner as in Example 1 to join the copper sheet to the Ni—P metallic interposing layer. The size of the copper sheet is given in Table 13.

The joined body thus prepared was analyzed by ultrasonic inspection and SEM at a magnification of 1,000 times. As a result, unacceptable defects, such as cracks and pinholes, were not found. The peel strength and warpage of each joined body were measured. The results are given in Table 13.

TABLE 13

| Sample | Substrate Material | Preparation process | Thickness of Ni—P metallic interposing layer (μm) | Size difference ΔL (mm) | Size difference ΔW (mm) | Slanting angle θ₁ (°) | Slanting angle θ₂ (°) | Peel strength of conductor layer (kg/1 mm) | Warpage of member (μm/mm) |
|---|---|---|---|---|---|---|---|---|---|
| 193 | AlN | CF | 10 | +0.5 | +0.5 | 70 | 90 | 1.3 ~ 1.6 | 1.8 ~ 2.0 |
| 194 | Si₃N₄ | CF | 10 | +0.5 | +0.5 | 70 | 90 | 1.2 ~ 1.5 | 1.7 ~ 2.0 |
| 195 | Al₂O₃ | CF | 10 | +0.5 | +0.5 | 70 | 90 | 1.2 ~ 1.6 | 1.9 ~ 2.2 |

Example 12

AlN Si$_3$N$_4$ and Al$_2$O$_3$ sheets, having the same composition as described in Example 10, with the thickness being varied were prepared. Separately, a W paste was formed in the same manner as described above in connection with sample No. 176. The W paste was sintered in the same manner as described above in connection with sample No. 9 to prepare a cofired, metallized board. A copper sheet having the same length and width as the copper sheet described in Example 10 and a thickness different from the copper sheet described in Example 10 was joined to the metallized board in the same manner as in Example 10. For all the joined bodies thus prepared, the copper sheet was not extended from the W metallizing layer in the horizontal direction. The joined bodies thus prepared were analyzed by ultrasonic inspection and SEM at a magnification of 1,000 times. As a result, unacceptable defects, such as cracks and pinholes, were not found. The peel strength and warpage of the joined bodies were measured. The results are given in Table 14.

and reaches the upper limit of the warpage range acceptable in practical use, whereas, when the above relational expression is satisfied, the degree of warpage of the joined body is acceptable even in the case of joining of the copper sheet to one side.

Example 13

A cofired, metallized board was prepared in the same manner as described above in connection with sample No. 176 of Example 10. The length, width, and thickness were the same as those in Example 10. Different copper sheets with the shape of the side face being varied were prepared by pressing and etching. These copper sheets were joined to the metallized board in the same manner as in Example 10. Regarding the form of steps provided on the side face, the number of steps, the length in the planar direction, and the thickness were given in Table 15. For all the joined bodies of the copper sheet thus prepared, the copper sheet was not extended from the W metallizing layer in the horizontal

TABLE 14

| Sample | Material | Preparation process | Thickness of substrate (mm) | Thickness of copper sheet (mm) | Peel strength of conductor layer (kg/1 mm) | Warpage of member (μm/mm) | Copper sheet joined face |
|---|---|---|---|---|---|---|---|
| 196 | AlN | CF | 0.50 | 0.2 | 0.6 ~ 1.2 | 0.6 ~ 1.0 | Both sides |
| 197 |  |  | 0.50 | 0.2 | 0.6 ~ 1.2 | 2.8 ~ 3.0 | One side |
| 198 |  |  | 0.59 | 0.2 | 0.6 ~ 1.2 | 0.8 ~ 1.2 | One side |
| 199 | Al₂O₃ | CF | 0.52 | 0.3 | 0.6 ~ 1.2 | 0.7 ~ 1.1 | Both sides |
| 200 |  |  | 0.52 | 0.3 | 0.6 ~ 1.2 | 2.7 ~ 2.9 | One side |
| 201 |  |  | 0.64 | 0.3 | 0.6 ~ 1.2 | 0.8 ~ 1.1 | One side |
| 202 | Si₃N₄ | CF | 0.55 | 0.4 | 0.6 ~ 1.2 | 0.8 ~ 1.0 | Both sides |
| 203 |  |  | 0.55 | 0.4 | 0.6 ~ 1.2 | 2.8 ~ 3.0 | One side |
| 204 |  |  | 0.69 | 0.4 | 0.6 ~ 1.2 | 0.6 ~ 0.9 | One side |

From the above results, it is apparent that, when the thickness of the ceramic substrate and the thickness of the copper sheet do not satisfy the relationship $y \geq 0.5x + 0.48$ wherein y represents the thickness of the ceramic substrate and x represents the thickness of the copper sheet, in joining of the copper sheet to one side, the warpage becomes large direction. The joined bodies thus prepared were analyzed by ultrasonic inspection and SEM at a magnification of 1,000 times. As a result, unacceptable defects, such as cracks and pinholes, were not found. The peel strength and warpage of the joined bodies were measured. The results are given in Table 15.

TABLE 15

| Sample | Material | Preparation process | Number of steps of copper sheet | Thickness of lowermost step (mm) | Length of lowermost step (mm) | Thickness of 2nd step (mm) | Length of 2nd step (mm) | Peel strength of conductor layer (kg/mm) | Warpage of member (μm/mm) |
|---|---|---|---|---|---|---|---|---|---|
| *205 | AlN | CF | 1 | 0.3 | — |  |  | 1.8 ~ 2.2 | 0.9 ~ 1.2 |
| 206 | " | " | 2 | 0.03 | 0.25 |  |  | 1.6 ~ 2.1 | 0.6 ~ 0.9 |

TABLE 15-continued

| Sample | Material | Preparation process | Number of steps of copper sheet | Thickness of lowermost step (mm) | Length of lowermost step (mm) | Thickness of 2nd step (mm) | Length of 2nd step (mm) | Peel strength of conductor layer (kg/mm) | Warpage of member (μm/mm) |
|---|---|---|---|---|---|---|---|---|---|
| *207 | " | " | 2 | 0.20 | 0.10 | | | 1.7 ~ 1.9 | 0.8 ~ 1.1 |
| 208 | " | " | 3 | 0.05 | 0.15 | 0.05 | 0.15 | 1.6 ~ 1.9 | 0.5 ~ 0.8 |
| *209 | " | " | 1 | 0.3 | — | | | 1.7 ~ 2.0 | 0.9 ~ 1.2 |
| 210 | " | " | 2 | 0.08 | 0.20 | | | 1.6 ~ 1.8 | 0.7 ~ 1.0 |
| *211 | " | " | 2 | 0.20 | 0.05 | | | 1.8 ~ 2.0 | 1.0 ~ 1.2 |
| 212 | " | " | 3 | 0.04 | 0.20 | 0.05 | 0.15 | 1.6 ~ 2.2 | 0.7 · 0.9 |
| *213 | Si₃N₄ | CF | 1 | 0.3 | | | | 1.8 ~ 2.1 | 0.8 ~ 1.2 |
| 214 | " | " | 2 | 0.04 | 0.25 | | | 1.9 ~ 2.2 | 0.6 ~ 0.9 |
| *215 | " | " | 2 | 0.20 | 0.13 | | | 1.6 ~ 2.2 | 0.9 ~ 1.3 |
| 216 | " | " | 3 | 0.10 | 0.25 | 0.05 | 0.15 | 1.6 ~ 1.9 | 0.5 ~ 1.0 |

From the above results, it is apparent that the degree of warpage can be further reduced when one or two or more steps are provided in the side portion of the conductor layer and, regarding the lowermost step, the thickness of is not more than one-third of the thickness thereof the whole conductor layer and the length of the collar portion is not less than half of the thickness of the whole conductor layer.

Example 14

Figure 7:
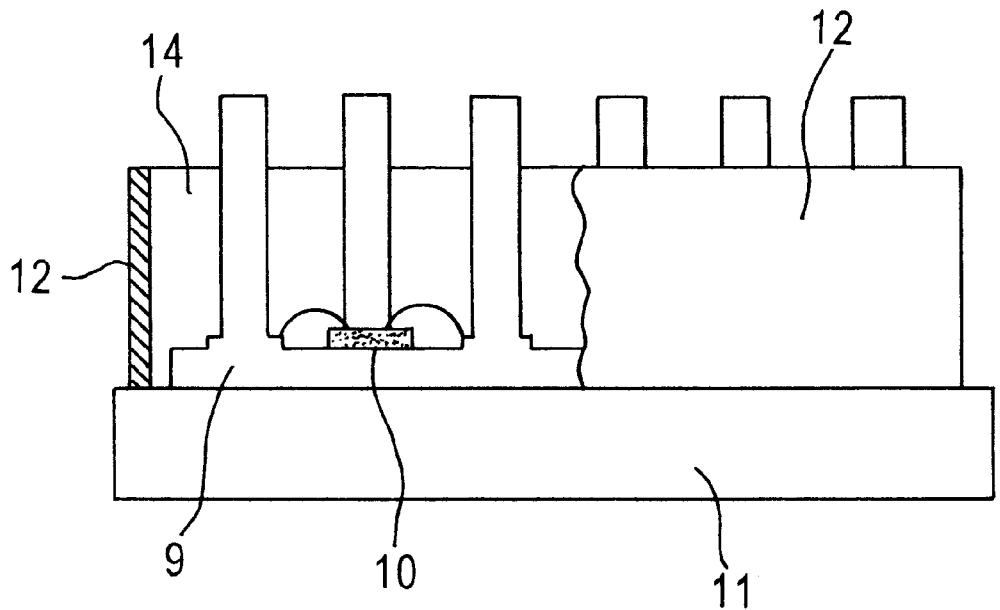
FIG. 7 is a schematic diagram showing a semiconductor device with a semiconductor element mounted thereon using a board, according to the present invention, prepared in Example 7.
Figure 8:
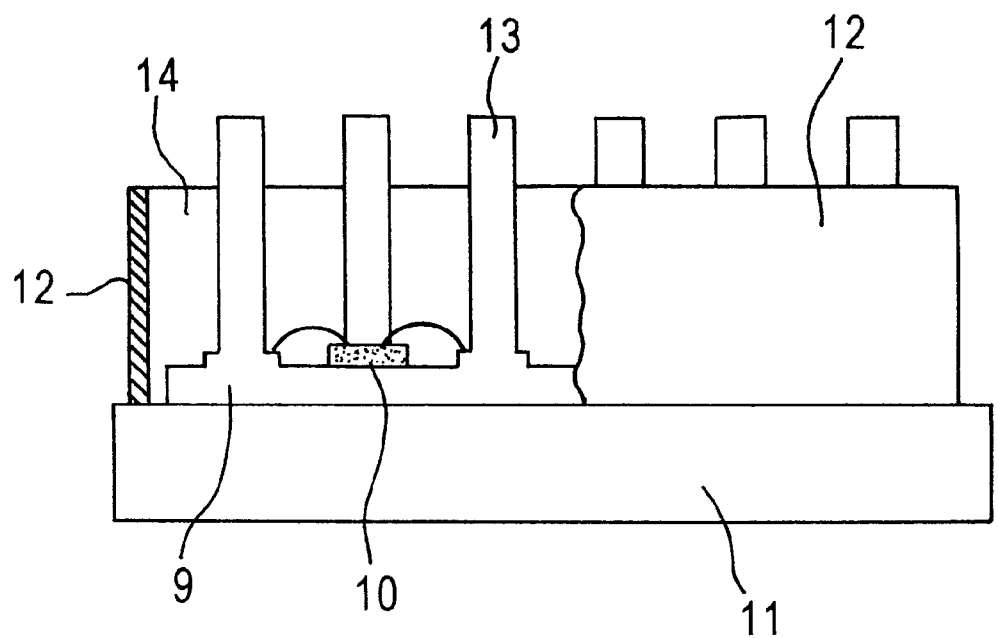
FIG. 8 is a schematic diagram showing a semiconductor device using a board, according to the present invention, prepared in Example 7.

Boards of sample Nos. 4, 12, 15, 24, 28, 49, 55, 63, 66, 67, 68, 69, 72, 73, 74, 79, 80, 81, 86, 90, 94, 98, 102, 106, 134, 139, 145, 146, 158, 159, 160, 161, 162, 163, 165, 166, 167, 175, 181, 187, 193, 194, 195, 196, 198, 199, 201, 202, 204, 206, 210, and 214 (an Ni plating as an outer layer being provided for samples 181 to 214) were selected from the samples prepared in the above Examples. These boards were used to prepare semiconductor devices having a sectional structure shown in FIG. 7. A semiconductor element 10 was die-bonded with high-temperature solder onto each of the boards. The protruded copper sheet portion was bent at 90° so that it can serve as an external terminal 13 as shown in FIG. 8. This assembly was then accommodated in a casing 12, followed by filling of a resin sealing layer 14 to prepare semiconductor devices.

Figure 17:
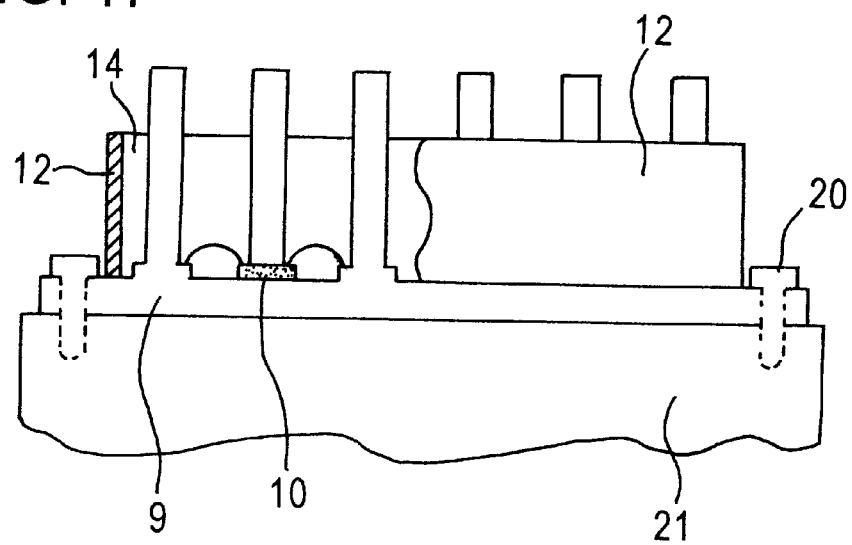
FIG. 17 is a schematic diagram showing a cooling system using a semiconductor device with the board according to the present invention mounted thereon.

These semiconductor devices were subjected to a heat cycle test of 1,000-cycles. As a result, for all the semiconductor devices, any problem, which poses a problem in practical use, such as a defect or cracking, did not occur. Separately, semiconductor devices, mounted with each of the sample boards of the present invention, shown in FIG. 7 were actually attached to a cooling section (a water-cooled radiator) 21, shown in FIG. 17, by means of a fixture (a bolt) 20, and, in this state, a continuous 1,000-hr endurance test was carried out. After the test, any unacceptable problem such as described above was not found. Thus, the board having a joined structure comprising the interposing layer of go the present invention provided on a ceramic substrate can provide a semiconductor device having much higher reliability than the conventional board. The board of the present invention having the above basic joined structure has excellent reliability particularly for high power modules.

Industrial Applicability

According to the present invention, in mounting a metallic member, such as a lead frame of copper, Kovar or the like, onto a ceramic substrate, troubles created in conventional joining utilizing a conventional silver-based or copper-based brazing material or a copper oxide-copper-based eutectic crystal on a metallizing layer, such as breaking or deformation of the substrate, can be avoided. Therefore, neither cracking nor warpage is created at the time of mounting and during use, and a copper circuit-joined board having high peel strength of joint, which is very reliable from the practical point of view, can be easily provided at a low cost.

What is claimed is:

1. A copper circuit-joined board comprising one joining unit or a laminate of two or more joining units joined to each other or one another, the joining units each comprising a ceramic substrate and a conductor layer, comprising copper as a main component, provided on the ceramic substrate through an interposing layer, wherein, in all the joining units, the length and width in the planar direction of the conductor layer in the joined interface of the conductor layer and the interposing layer are at least 0.05 mm shorter than those in the planar direction of the interposing layer, the outer peripheral side portion of the conductor layer in the joined interface of the conductor layer and the interposing layer being not extended from the outer peripheral side portion of the interposing layer, at least a part of the side portion of the conductor layer excluding the joined interface of the conductor layer and the interposing layer being extended from the side portion of the interposing layer in at least one of the joining units.

2. The copper circuit-joined board according to claim 1, wherein, when the number of joining units is one, no conductor layer is provided on a part of the interposing layer and, when the number of joining units is two or more, no conducive layer is provided on a part or the whole of the interposing layer.

3. The copper circuit-joined board according to claim 1, wherein the angle of the side portion of the conductor layer to the joined interface of the conductor layer and the interposing layer is not more than 80°.

4. The copper circuit-joined board according to claim 1, wherein, in at least one joining unit, the side portion of the conductor layer is step-formed.

5. The copper circuit-joined board according to claim 4, wherein, in the step-formed portion, the height of the lowermost step joined to the interposing layer is not more than one-third of the thickness of the whole conductor layer, and the length of a collar portion of the lowermost step portion in the joined interface of the conductor layer and the interposing layer is not less than half of the thickness of the whole conductor layer.

6. The copper circuit-joined board according to claim 1, wherein an outer layer comprising nickel as a main component is provided on the outer surface of the conductor layer and the interposing layer.

7. The copper circuit-joined board according to claim 1, wherein the interposing layer comprises a brazing material layer comprising at least one of silver and copper as a main component and an active metal.

8. The copper circuit-joined board according to claim 7, wherein the interposing layer comprises the brazing material layer and a low-melting metallizing layer, having a melting point of 1,000° C. or below, comprising as a main component at least one member selected from the group consisting of nickel, iron, and copper in that order from the substrate side.

9. The copper circuit-joined board according to claim 8, wherein the low-melting metallizing layer comprises an Ni—P layer.

10. The copper circuit-joined board according to claim 8, wherein the low-melting metallizing layer comprises Ni—B and Ni—P in that order from the substrate side.

11. The copper circuit-joined board according to claim 8, wherein the low-melting metallizing layer in the interposing layer has a thickness of 2 to 40 μm.

12. The copper circuit-joined board according to claim 7, wherein the interposing layer comprises a high-melting metallizing layer comprising a high-melting metal as a main component and the brazing material layer in that order from the substrate side.

13. The copper circuit-joined board according to claim 12, wherein the high-melting metallizing layer has a surface roughness Ra of not more than 4 μm.

14. The copper circuit-joined board according to claim 12, wherein the high-melting metallizing layer in the interposing layer as a thickness of 3 to 50 μm.

15. The copper circuit-joined board according to claim 7, wherein the active metal contained in the brazing material layer is a group IVa or Va metal.

16. The copper circuit-joined board according to claim 7, wherein the brazing material layer in the interposing layer has a thickness of 3 to 50 μm.

17. The copper circuit-joined board according to claim 1, wherein the interposing layer comprises a high-melting metallizing layer and a low-melting metallizing layer in that order from the substrate side.

18. The copper circuit-joined board according to claim 17, wherein the high-melting metallizing layer has a surface roughness Ra of not more than 4 μm.

19. The copper circuit-joined board according to claim 17, wherein the low-melting metallizing layer comprises an Ni—P layer.

20. The copper circuit-joined board according to claim 17, wherein the low-melting metallizing layer comprises Ni—B and Ni—P in that order from the substrate side.

21. The copper circuit-joined board according to claim 17, wherein the high-melting metallizing layer in the interposing layer has a thickness of 3 to 50 μm.

22. The copper circuit-joined board according to claim 17, wherein the low-melting metallizing layer in the interposing layer has a thickness of 2 to 40 μm.

23. The copper circuit-joined board according to claim 1, wherein, in at least one joining unit, the thickness of the conductor layer and the thickness of the ceramic substrate have a relationship satisfying the requirement $y \geq 0.5x+0.48$ wherein x represents the thickness of the conductor layer, mm, and y represents the thickness of the ceramic substrate, mm.

24. The copper circuit-joined board according to claim 1, wherein the substrate comprises an aluminum nitride ceramic.

25. The copper circuit-joined board according to claim 1, wherein the substrate comprises a silicon nitride ceramic.

26. A semiconductor device comprising a semiconductor element which has been die-bonded to the copper circuit-joined board according to claim 1.

27. A cooling system including the semiconductor device according to claim 26.

28. A copper circuit-joined board comprising a laminate of two or more joining units joined to each other or one another, the joining units each comprising a ceramic substrate and a conductor layer, comprising copper as a main component, provided on the ceramic substrate through an interposing layer, wherein the interposing layer consists of a high-melting metallizing layer, comprising a high-melting metal as a main component, and a low-melting metallizing layer, having a melting point of 1,000° C. or below and comprising as a main component at least one member selected from the group consisting of nickel, iron and copper, in that order from the substrate side, and wherein, in all the joining units, the length and width in the planar direction of the conductor layer in the joined interface of the conductor layer and the interposing layer are at least 0.05 mm shorter than those in the planar direction of the interposing layer, the outer peripheral side portion of the conductor layer in the joined interface of the conductor layer and the interposing layer being not extended from the outer peripheral side portion of the interposing layer, the side portion of the conductor layer being not extended from the side portion of the interposing layer in all the joining units.

29. The copper circuit-joined board according to claim 28, wherein no conducive layer is provided on a part or the whole of the interposing layer.

30. The copper circuit-joined board according to claim 28, wherein the angle of the side portion of the conductor layer to the joined interface of the conductor layer and the interposing layer is not more than 80°.

31. The copper circuit-joined board according to claim 28, wherein, in at least one joining unit, the side portion of the conductor layer is step-formed.

32. The copper circuit-joined board according to claim 31, wherein, in the step-formed portion, the height of the lowermost step joined to the interposing layer is not more than one-third of the thickness of the whole conductor layer, and the length of a collar portion of the lowermost step portion in the joined interface of the conductor layer and the interposing layer is not less than half of the thickness of the whole conductor layer.

33. The copper circuit-joined board according to claim 28, wherein an outer layer comprising nickel as a main component is provided on the outer surface of the conductor layer and the interposing layer.

34. The copper circuit-joined board according to claim 28, wherein the high-melting metallizing layer has a surface roughness Ra of not more than 4 μm.

35. The copper circuit-joined board according to claim 28, wherein the low-melting metallizing layer comprises an Ni—P layer.

36. The copper circuit-joined board according to claim 28, wherein the low-melting metallizing layer comprises Ni—B and Ni—P in that order from the substrate side.

37. The copper circuit-joined board according to claim 28, wherein the high-melting metallizing layer in the interposing layer has a thickness of 3 to 50 μm.

38. The copper circuit-joined board according to claim 28, wherein the low-melting metallizing layer in the interposing layer has a thickness of 2 to 40 μm.

39. The copper circuit-joined board according to claim 28, wherein, in at least one joining unit, the thickness of the conductor layer and the thickness of the ceramic substrate have a relationship satisfying the requirement $y \geq 0.5x+0.48$ wherein x represents the thickness of the conductor layer, mm, and y represents the thickness of the ceramic substrate, mm.

40. The copper circuit-joined board according to claim 28, wherein the substrate comprises an aluminum nitride ceramic.

41. The copper circuit-joined board according to claim 28, wherein the substrate comprises a silicon nitride ceramic.

42. A semiconductor device comprising a semiconductor element which has been die-bonded to the copper circuit-joined board according to claim 28.

43. A cooling system including the semiconductor device according to claim 42.

44. A process for preparing a copper circuit-joined board comprising one joining unit or a laminate of two or more joining units joined to each other or one another, the joining units each comprising a ceramic substrate and a conductor layer, comprising copper as a main component, provided on the ceramic substrate through an interposing layer, said process comprising the steps of: (1) providing a ceramic substrate; (2) providing conductor materials, the length and width in the planar direction of the conductor materials each in its portion to be directly joined to the interposing layer being at least 0.05 mm shorter than those in the planar direction of the interposing layer, the conductor materials being in such a form that, after joining, at least a part of the end in the planar direction of the portion not to be joined directly to the interposing layer is extended from the end of the interposing layer in at least one of the joining units; (3) selecting the materials, for each lamination unit, as a conductor layer material, disposing a material for the interposing layer between the substrate and the conductor layer material to prepare a joining unit, and then providing the joining unit by one as a joining assembly or repeatedly laminating the joining unit twice or more on top of each other or one another to prepare a joining assembly; (4) heating the assembly in the temperature range of the melting point of the component(s) of the interposing layer to below the melting point of the conductor layer material to form a joined body; and (5) finishing the joined body.

45. The process for preparing a copper circuit-joined board according to claim 44, wherein, in any of the step of providing the conductor layer material and the step of finishing the joined body, the conductor layer material is previously shaped so that, after joining, the side constituting a face to be joined directly to the interposing layer makes an angle of not more than 80° with the direction of the joined interface of the conductor layer and the interposing layer.

46. The process for preparing a copper circuit-joined board according to claim 44, wherein the step of finishing the joined body involves the formation of a layer comprising Ni as a main component on the outer surface of the joined body.

47. The process for preparing a copper circuit-joined board according to claim 44, wherein the interposing layer material is a brazing material comprising at least one member, selected from the group consisting of Ag and Cu, as a main component and an active metal.

48. The process for preparing a copper circuit-joined board according to claim 47, wherein the active metal contained in the brazing material is a group IVa metal.

49. The process for preparing a copper circuit joined board according to claim 47 wherein, in the step of selecting, in addition to the brazing material, a low-melting metal material, having a metal point of 1,000° C. or below, comprising as a main component at least one member selected from the group consisting of Ni, Fe, and Cu as the interposing layer material and forming the joining assembly, the brazing material and the low-melting metal material are disposed to form the brazing material layer and a low-melting metallizing layer as the interposing layer in that order from the substrate side.

50. The process for preparing a copper circuit-joined board according to claim 49, wherein the low-melting metallizing layer is constituted by a plating comprising an Ni—P component.

51. The process for preparing a copper circuit-joined board according claim 49, wherein the low-melting metallizing layer is constituted by a plating comprising an Ni—B component and a plating comprising an Ni—P component provided in that order from the substrate side.

52. The process for preparing a copper circuit-joined board according to claim 49, wherein the thickness of the low-melting metallizing layer in the interposing layer is 2 to 40 $\mu$m.

53. The process for preparing a copper circuit-joined board according to claim 49, wherein the thickness of the brazing material layer is 3 to 50 $\mu$m after joining.

54. The process for preparing a copper circuit-joined board according to claim 47, wherein the thickness of the brazing material layer in the interposing layer is 3 to 50 $\mu$m after joining.

55. The process for preparing a copper circuit-joined board according to claim 44, wherein the step of providing the ceramic substrate involves the step of coating the ceramic substrate with a paste containing a high-melting metal and firing the coating to form a high-melting metallizing layer and the step of forming the joining assembly involves the step of interposing the brazing material or the low-melting metal material to form a brazing material layer and a low-melting metallizing layer between the high-melting metallizing layer and the conductor layer material.

56. The process for preparing a copper circuit-joined board according to claim 55, wherein the low-melting metallizing layer is constituted by a plating comprising an Ni—P component.

57. The process for preparing a copper circuit-joined board according to claim 55, wherein the low-melting metallizing layer is constituted by a plating comprising an Ni—B component and a plating comprising an Ni—P component provided in that order from the substrate side.

58. The process for preparing a copper circuit-joined board according to claim 55, wherein the thickness of the brazing material layer in the interposing layer is 3 to 50 $\mu$m after joining.

59. The process for preparing a copper circuit-joined board according to claim 55, wherein the thickness of the high-melting metallizing layer in the interposing layer is 3 to 50 $\mu$m after joining.

60. The process for preparing a copper circuit-joined board according to claim 55, wherein the thickness of the low-melting metallizing layer in the interposing layer is 2 to 40 $\mu$m.

61. The process for preparing a copper circuit-joined board according to claim 44, wherein the step of providing the ceramic substrate involves the step of coating the surface of a green compact of a starting powder having the composition of the ceramic with a paste containing a high-melting metal and firing the coated ceramic substrate to sinter the ceramic compact and, at the same time, to form a high-melting metallizing layer and, in the step of forming the joining assembly, the brazing material or the low-melting metal material is interposed between the high-melting metallizing layer and the conductor layer material.

62. The process for preparing a copper circuit-joined board according to claim 61, wherein the low-melting metallizing layer is constituted by a plating comprising an Ni—P component.

63. The process for preparing a copper circuit-joined board according to claim 61, wherein the low-melting metallizing layer is constituted by a plating comprising an Ni—B component and a plating comprising an Ni—P component provided in that order from the substrate side.

64. The process for preparing a copper circuit-joined board according to claim 61, wherein the thickness of the brazing material layer in the interposing layer is 3 to 50 μm after joining.

65. The process for preparing a copper circuit-joined board according to claim 61, wherein the thickness of the high-melting metallizing layer in the interposing layer is 3 to 50 μm after joining.

66. The process for preparing a copper circuit-joined board according to claim 61, wherein the thickness of the low-melting metallizing layer in the interposing layer is 2 to 40 μm.

67. The process for preparing a copper circuit-joined board according to claim 44, wherein the substrate comprises an aluminum nitride ceramic.

68. The process for preparing a copper circuit-joined board according to claim 44, wherein the substrate comprises a silicon nitride ceramic.

69. A process for preparing a copper circuit-joined board comprising a laminate of two or more joining units joined to each other or one another, the joining units each comprising a ceramic substrate and a conductor layer, comprising copper as a main component, provided on the ceramic substrate through an interposing layer, said process comprising the steps of: (1) providing a ceramic substrate including the formation of a high-melting metallizing layer comprising a high-melting metal as a main component; (2) providing a conductor materials, the length and width in the planar direction of the conductor materials each in its portion to be directly joined to the interposing layer being at least 0.05 mm shorter than those in the planar direction of the interposing layer, the conductor materials each being in such a form that, after joining, the portion not to be joined directly to the interposing layer in the planar direction is not extended from the end of the interposing layer; (3) selecting the materials, for each lamination unit, as a conductor layer material, disposing a low-melting metal material to form a low-melting metallizing layer for the interposing layer between the substrate and the conductor layer material to prepare a joining unit, and then providing the joining units by repeatedly laminating the joining unit twice or more on top of each other or one another to prepare a joining assembly; (4) heating the assembly in the temperature range of the melting point of the component (s) of the interposing layer to below the melting point of the conductor layer material to form a joined body; and (5) finishing the joined body, wherein the interposing layer is constituted by the high-melting metallizing layer and the low-melting metallizing layer in that order from the substrate side, the low-melting metallizing layer having a melting point of 1,000° C. or below and comprising as a main component at least one member selected from the group consisting of nickel, iron and copper.

70. The process for preparing a copper circuit-joined board according to claim 69, wherein, in any of the step of providing the conductor layer material and the step of finishing the joined body, the conductor layer material is previously shaped so that, after joining, the side constituting a face to be joined directly to the interposing layer makes an angle of not more than 80° with the direction of the joined interface of the conductor layer and the interposing layer.

71. The process for preparing a copper circuit-joined board according to claim 69, wherein the step of finishing the joined body involves the formation of a layer comprising Ni as a main component on the outer surf ace of the joined body.

72. The process for preparing a copper circuit-joined board according to claim 69, wherein the step of providing the ceramic substrate involves the step of coating the ceramic substrate with a paste containing the high-melting metal and firing the coating to form the high-melting metallizing layer.

73. The process for preparing a copper circuit-joined board according to claim 69, wherein the step of providing the ceramic substrate involves the step of coating the surface of a green compact of a starting powder having the composition of the ceramic with a paste containing the high-melting metal and firing the coated ceramic substrate to sinter the ceramic compact.

74. The process for preparing a copper circuit-joined board according to claim 69, wherein the low-melting metallizing layer is constituted by a plating comprising an Ni—P component.

75. The process for preparing a copper circuit-joined board according to claim 69, wherein the low-melting metallizing layer is constituted by a plating comprising an Ni—B component and a plating comprising an Ni—P component provided in that order from the substrate side.

76. The process for preparing a copper circuit-joined board according to claim 69, wherein the thickness of the high-melting metallizing layer in the interposing layer is 3 to 50 μm after joining.

77. The process for preparing a copper circuit-joined board according to claim 69, wherein the thickness of the low-melting metallizing layer in the interposing layer is 2 to 40 μm.

78. The process for preparing a copper circuit-joined board according to claim 69, wherein the substrate comprises an aluminum nitride ceramic.

79. The process for preparing a copper circuit-joined board according to claim 69, wherein the substrate comprises a silicon nitride ceramic.

* * * * *